(12) United States Patent
Fujikawa

(10) Patent No.: US 11,333,910 B2
(45) Date of Patent: May 17, 2022

(54) ELECTRO-OPTICAL DEVICE WITH A PRE-CHARGE CIRCUIT BETWEEN PRE-CHARGE CONTROL SIGNAL LINES

(71) Applicant: SEIKO EPSON CORPORATION, Tokyo (JP)

(72) Inventor: Shinsuke Fujikawa, Chino (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

(21) Appl. No.: 16/688,131

(22) Filed: Nov. 19, 2019

(65) Prior Publication Data

US 2020/0159053 A1 May 21, 2020

(30) Foreign Application Priority Data

Nov. 20, 2018 (JP) .............................. JP2018-217035

(51) Int. Cl.
*G09G 3/36* (2006.01)
*G02F 1/133* (2006.01)
*H01L 27/12* (2006.01)
*G02F 1/1345* (2006.01)
(Continued)

(52) U.S. Cl.
CPC ........ *G02F 1/13306* (2013.01); *G02F 1/1368* (2013.01); *G02F 1/13454* (2013.01); *G02F 1/136286* (2013.01); *G09G 3/3607* (2013.01); *G09G 3/3677* (2013.01); *H01L 27/124* (2013.01); *G09G 2300/0426* (2013.01); *G09G 2310/0202* (2013.01); *G09G 2310/0251* (2013.01); *G09G 2310/0297* (2013.01)

(58) Field of Classification Search
None
See application file for complete search history.

(56) References Cited

U.S. PATENT DOCUMENTS

2006/0221701 A1* 10/2006 Sun ...................... G09G 3/3648
365/185.22
2006/0232538 A1 10/2006 Kobashi et al.
(Continued)

FOREIGN PATENT DOCUMENTS

JP H11-202294 A 7/1999
JP 2006-276794 A 10/2006
(Continued)

*Primary Examiner* — Amr A Awad
*Assistant Examiner* — Donna V Bocar
(74) *Attorney, Agent, or Firm* — Oliff PLC

(57) ABSTRACT

An electro-optical device includes a scanning line, a first signal line and a second signal line, a first pixel, a second pixel, a signal line driving circuit configured to supply an image signal to the first pixel and the second pixel, a first pre-charge control signal line configured to supply a first pre-charge control signal, a second pre-charge control signal line configured to supply a second pre-charge control signal, and a pre-charge circuit disposed between the first pre-charge control signal line and the second pre-charge control signal line and configured to supply a pre-charge signal to the first signal line and the second signal line, in which the pre-charge circuit includes a first switching unit configured to supply the pre-charge signal to the first signal line and a second switching unit configured to supply the pre-charge signal to the second signal line.

14 Claims, 11 Drawing Sheets

(51) Int. Cl.
*G02F 1/1362* (2006.01)
*G02F 1/1368* (2006.01)

(56) References Cited

U.S. PATENT DOCUMENTS

| | | | |
|---|---|---|---|
| 2009/0067029 A1* | 3/2009 | Yamada | H05K 1/189 |
| | | | 359/245 |
| 2014/0055440 A1* | 2/2014 | Cho | G09G 3/36 |
| | | | 345/212 |
| 2015/0154926 A1 | 6/2015 | Fujikawa | |
| 2015/0287749 A1* | 10/2015 | Miyake | H01L 29/78648 |
| | | | 257/71 |
| 2017/0186390 A1 | 6/2017 | Fujikawa | |
| 2017/0270875 A1 | 9/2017 | Enami | |
| 2017/0270887 A1* | 9/2017 | Yonemochi | G09G 3/3648 |
| 2019/0005885 A1* | 1/2019 | Kim | H01L 27/1218 |
| 2019/0139505 A1 | 5/2019 | Fujikawa | |
| 2019/0318700 A1* | 10/2019 | Iwase | G09G 3/3614 |
| 2020/0027390 A1* | 1/2020 | Lee | G09G 3/3275 |

FOREIGN PATENT DOCUMENTS

| | | |
|---|---|---|
| JP | 2011-186362 A | 9/2011 |
| JP | 2011-191476 A | 9/2011 |
| JP | 2015-106108 A | 6/2015 |
| JP | 2017-120300 A | 7/2017 |
| JP | 2017-167424 A | 9/2017 |
| KR | 20070081624 A | 8/2007 |

* cited by examiner

ELECTRO-OPTICAL DEVICE WITH A PRE-CHARGE CIRCUIT BETWEEN PRE-CHARGE CONTROL SIGNAL LINES

The present application is based on, and claims priority from JP Application Serial Number 2018-217035, filed Nov. 20, 2018, the disclosure of which is hereby incorporated by reference herein in its entirety.

BACKGROUND

1. Technical Field

The present disclosure relates to an electro-optical device and an electronic apparatus.

2. Related Art

An electro-optical device that displays an image using a liquid crystal element supplies a video voltage based on an image signal designating a gradation of each of the pixels to each of the pixels via a signal line, to control such that transmittance of the liquid crystal contained in each of the pixels is set to a transmittance based on the video voltage. This allows the gradation of each of the pixels to be set to the gradation designated by the image signal.

When writing of the video voltage to each of the pixels is insufficient, such as in a case that time for supplying the video voltage to each of the pixels cannot be sufficiently ensured, each of the pixels may occasionally be unable to accurately display the gradation designated by the image signal. Thus, the electro-optical device of the related art, for example, performs a pre-charge operation for charging a signal line to a predetermined voltage level to prevent insufficient writing of the video voltage to each of the pixels. For example, JP 2015-106108 A discloses an electro-optical device that simultaneously performs, during one horizontal scanning period, a pre-charge operation for some of a plurality of signal lines and writing of a video voltage to pixels.

In this type of electro-optical device, the signal line is coupled, via a pre-charge switching element, to a pre-charge power supply line to which the pre-charge signal is supplied. The pre-charge switching element, which includes a control terminal coupled to a pre-charge control signal line, is set to a conductive state or a non-conductive state in accordance with a level of the pre-charge control signal supplied to the control terminal via the pre-charge control signal line. A greater current flowing in the signal line from the pre-charge switching element allows a pre-charge operation to be performed at a higher rate.

However, the capability of the pre-charge switching element is made higher to increase the current flowing in the signal line from the pre-charge switching element, then the driving load for driving the pre-charge switching element also becomes greater. Thus, in view of the wiring resistance, the driving load, and the like of the pre-charge control signal line, the circuit layout of the related art may occasionally be unable to drive the pre-charge switching element that can be pre-charged at a high rate of speed.

SUMMARY

In order to address the above-described issues, an aspect of the electro-optical device according to the present disclosure includes a scanning line extending along a first direction, a first signal line and a second signal line extending along a second direction intersecting the first direction, a first pixel provided corresponding to an intersection between the scanning line and the first signal line, a second pixel provided corresponding to an intersection between the scanning line and the second signal line, a signal line driving circuit configured to supply an image signal to the first pixel and the second pixel, a first pre-charge control signal line extending in the first direction, the first pre-charge control signal line being configured to supply a first pre-charge control signal, a second pre-charge control signal line extending in the first direction, the second pre-charge control signal line being configured to supply a second pre-charge control signal, and a pre-charge circuit disposed between the first pre-charge control signal line and the second pre-charge control signal line, the pre-charge circuit being configured to supply a pre-charge signal to the first signal line and the second signal line, in which the pre-charge circuit includes a first switching unit configured to supply the pre-charge signal to the first signal line in accordance with the first pre-charge control signal, and a second switching unit configured to supply the pre-charge signal to the second signal line in accordance with the second pre-charge control signal.

DESCRIPTION OF EXEMPLARY EMBODIMENTS

First Embodiment

Figure 1:
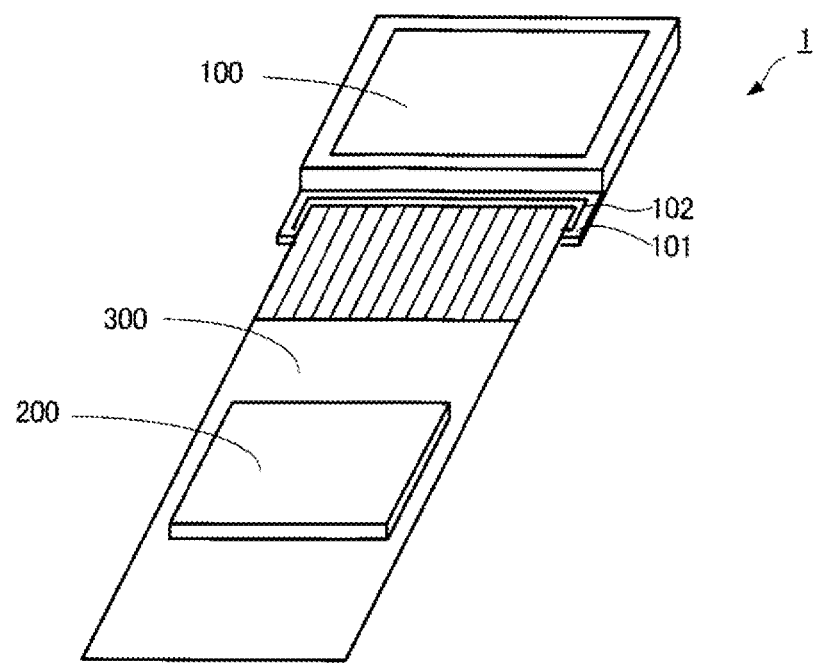
FIG. 1 is an explanatory view of an electro-optical device according to a first embodiment.

The first embodiment will be described below with reference to FIGS. 1 to 6. FIG. 1 is an explanatory view of an electro-optical device 1 according to the first embodiment. Note that FIG. 1 illustrates a configuration of a signal transmission system for the electro-optical device 1. The electro-optical device 1 includes an electro-optical panel 100, a drive integrated circuit 200 such as a driver Integrated Circuit (IC), and a flexible circuit board 300. The electro-optical panel 100 is coupled, via a terminal section 102 disposed on a first side 101 of the electro-optical panel 100, to the flexible circuit board 300 on which the drive integrated circuit 200 is mounted. Further, the electro-optical panel 100 is coupled to a non-illustrated host Central Processing Unit (CPU) device via the flexible circuit board 300 and the drive integrated circuit 200. The drive integrated circuit 200 is a device that receives an image signal and various control signals for drive control from the host CPU device via the flexible circuit board 300, and drives the electro-optical panel 100 via the flexible circuit board 300.

Figure 2:
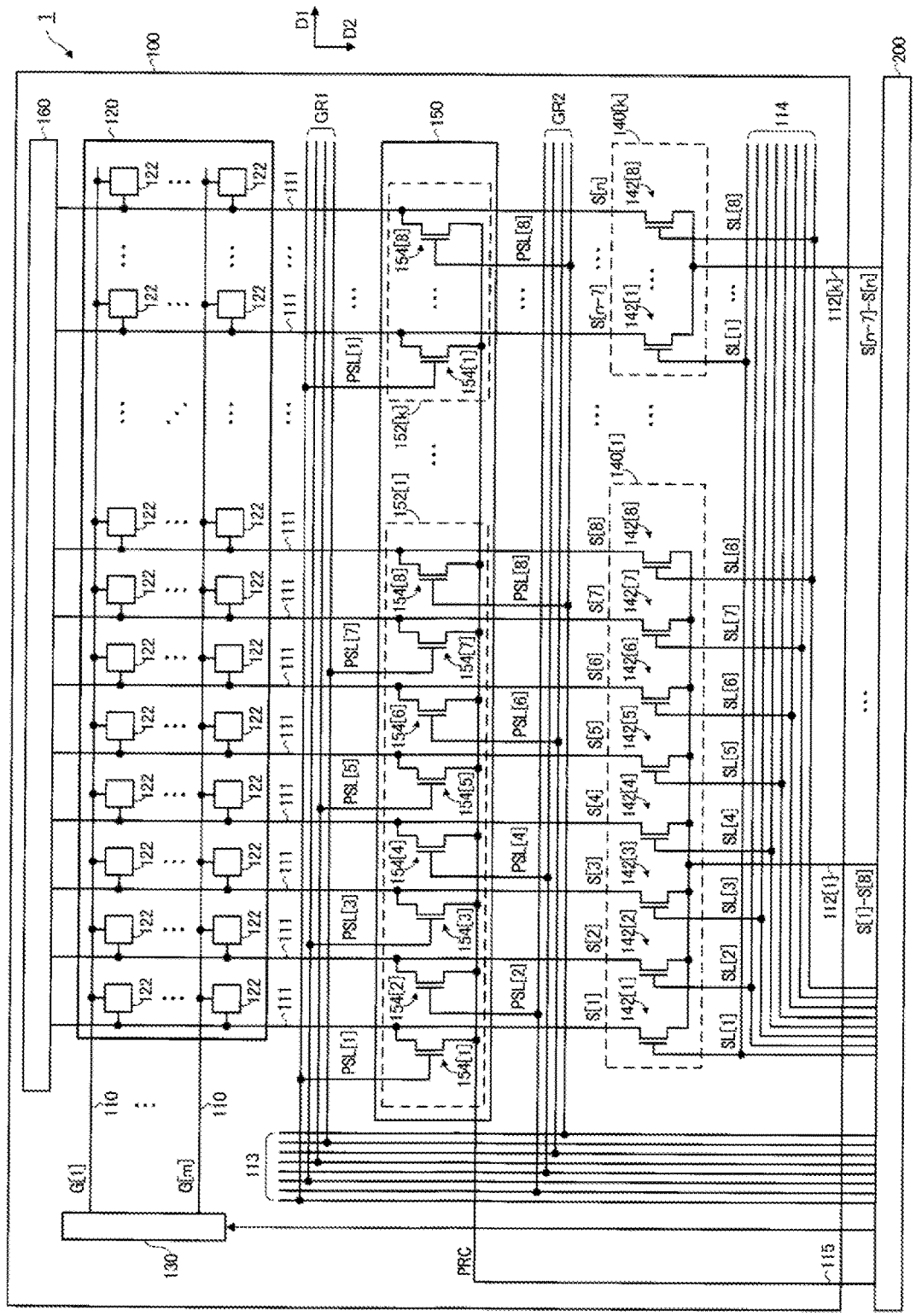
FIG. 2 is a block diagram illustrating a configuration of an electro-optical device according to a first embodiment.

FIG. 2 is a block diagram illustrating a configuration of the electro-optical device 1 according to the first embodiment. The electro-optical panel 100 of the electro-optical device 1 includes m scanning lines 110 extending along a first direction D1, n signal lines 111 extending along a second direction D2, a display region 120, a scanning line drive circuit 130, k demultiplexers 140[1] to 140[k], a pre-charge circuit 150, and an inspection circuit 160. Note that m, n, and k are natural numbers. In an example illustrated in FIG. 2, because the n signal lines 111 are classified into k signal line groups each of which includes eight signal lines 111, k is a value obtained by dividing n by 8. The electro-optical panel 100 includes, in addition to the m scanning lines 110 and the n signal lines 111, k data lines 112, a pre-charge control signal line 113 extending along the second direction D2, a writing selection signal line 114, a pre-charge power supply line 115, and the like.

Figure 3:
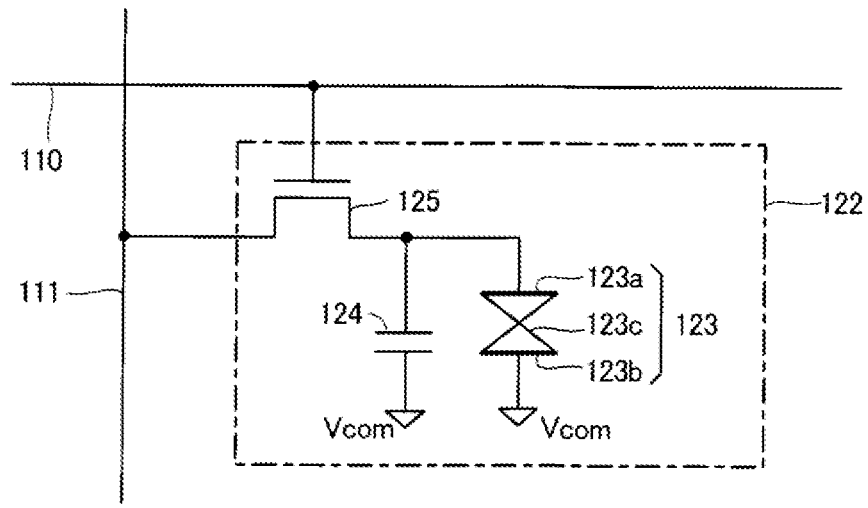
FIG. 3 is a circuit diagram illustrating a configuration of a pixel.

The display region 120 is a region that displays an image. For example, the display region 120 includes a pixel 122 provided corresponding to each of intersections between the respective m scanning lines 110 and the respective n signal lines 111. As illustrated in FIG. 3, the pixel 122 includes a liquid crystal 123c having transmittance that changes in accordance with an applied voltage. A display gradation of the pixel 122 changes due to the change of transmittance of the liquid crystal 123c in accordance with the voltage applied to the liquid crystal 123c. In FIG. 2, a row of the pixels 122 illustrated on a topmost side of the figure is a first row, and a column of the pixels 122 illustrated on a leftmost side of the figure is a first column. Further in FIG. 2, a direction along the first direction D1 is a direction along the row of the pixels 122, and a direction along the second direction D2 is a direction along the column of the pixels 122.

The scanning line drive circuit 130, which generates scanning signals G[1] to G[m] based on a control signal received from the drive integrated circuit 200, outputs the scanning signals G[1] to G[m] to the respective m scanning lines 110. For example, the scanning line drive circuit 130 sequentially activates the scanning signals G[1] to G[m] for the respective scanning lines 110 within a vertical scanning period for one horizontal scanning period. Not that, for example, a scanning signal G is activated for a time period during which the scanning signal G is maintained at a selected voltage, such as a high level, while the scanning signal G is deactivated for a time period during which the scanning signal G is maintained at a non-selected voltage, such as a low level.

Specifically, for a time period during which a scanning signal G[p] corresponding to a p-th row is maintained at the selected voltage, a scanning line 110 corresponding to the p-th row is in a selected state, and the respective liquid crystals 123c included in the respective n pixels 122 in the p-th row are electrically coupled to the respective n signal lines 111. Note that p is a natural number from 1 to m. Further, for a time period during which the scanning signal G[p] is maintained at the non-selected voltage, the scanning line 110 corresponding to the p-th row is in a non-selected state, where an electrical coupling state between the respective liquid crystals 123c included in the respective n pixels 122 in the p-th row and the respective n signal lines 111 is in a non-conductive state.

The k demultiplexers 140[1] to 140[k] are provided corresponding to the respective k signal line groups. For example, the k demultiplexers 140[1] to 140[k] receive the respective image signals S supplied from the drive integrated circuit 200 to the respective k data lines 112[1] to 112[k]. Note that, in the first embodiment, the signal lines 111 are divided in units of eight lines, thus the image signals S for eight pixels are supplied to one data line 112 in a time-division manner from the drive integrated circuit 200. Accordingly, the demultiplexer 140 supplies the image signal S to the eight signal lines 111 included in the corresponding signal line group in a time-division manner. This allows the image signal S to be supplied to a plurality of the pixels 122.

The demultiplexer 140 includes eight writing selection transistors 142[1] to 142[8] coupled to the respective eight signal lines 111 included in the corresponding signal line group. That is, provided that i is a natural number from 1 to k, one contacts of the respective eight writing selection transistors 142[1] to 142[8] of the demultiplexer 140[i] are coupled to the respective eight signal lines 111 from the 8×i—7-th column to the 8×i-th column. The other contacts of the respective eight writing selection transistors 142[1] to 142[8] of the demultiplexer 140[i], that is, the contacts that are not coupled to the signal line 111, are then commonly coupled to the data line 112[i]. The k data lines 112[1] to 112[k] are coupled, via the flexible circuit board 300, to the drive integrated circuit 200.

The writing selection transistors 142[1] to 142[8] of the demultiplexer 140[i] switch, between the conductive state and the non-conductive state, an electrical coupling state between the signal line 111 and the data line 112[i] in accordance with writing selection signals SL[1] to SL[8]. The writing selection transistors 142[1] to 142[8] are, for example, N-channel transistors constituted by thin film transistors (TFTs) or the like, and are set to one of the conductive state or the non-conductive state in accordance with levels of the writing selection signals SL[1] to SL[8] received by control terminals such as gates.

Note that the writing selection transistors 142[1] to 142[8] may be switching elements other than TFTs. The writing selection transistors 142[1] to 142[8] may also be P-channel transistors. In the following descriptions, a writing selection transistor 142[j] controlled by a writing selection signal SL[j] is also referred to as writing selection transistor 142 in the j-th sequence. Note that j is a natural number from 1 to 8.

Further, the signal line 111 coupled to the writing selection transistor 142[j] in the j-th sequence is also referred to as signal line 111 in the j-th sequence. Accordingly, the number or the like within square brackets of a reference sign of the writing selection signal SL corresponds to the sequence number of the signal line 111 to be controlled. Similarly, the number or the like within square brackets of a pre-charge control signal PSL, which will be described below, corresponds to the sequence number of the signal line 111 to be controlled.

The eight writing selection transistors 142[1] to 142[8] of the respective demultiplexers 140 receive the writing selection signals SL[1] to SL[8] from the drive integrated circuit 200 via the writing selection signal lines 114. The writing selection signal line 114 is coupled, via the flexible circuit board 300, to the drive integrated circuit 200. The writing selection signals SL[1] to SL[8] designate a start timing for outputting the image signal S to the signal line 111.

For example, provided that one writing selection signal SL[1] is at a high level and the other seven writing selection signals SL[2] to SL[8] are at a low level, only the k writing selection transistors 142[1] included in the respective k demultiplexers 140[1] to 140[k] are brought into the conductive state. Accordingly, the k demultiplexers 140[1] to 140[k] each output the image signals S supplied to the respective k data lines 112, to the signal line 111 in the first sequence of the respective signal line groups. Hereinafter, similarly, the k demultiplexers 140[1] to 140[k] each output the image signals S supplied to the respective k data lines 112, to the signal lines 111 in the second sequence, the third sequence, the fourth sequence, the fifth sequence, the sixth sequence, the seventh sequence, and the eighth sequence of the respective signal line groups. In the electro-optical panel 100 illustrated in FIG. 2, the demultiplexer 140 is disposed, on a side of the second direction D2 of the display region 120, between the terminal section 102 to which the flexible circuit board 300 is coupled and the display region 120.

The pre-charge circuit 150 supplies a pre-charge signal PRC to the n signal lines 111 in a predetermined order based on the pre-charge control signals PSL[1] to PSL[8]. Note that the pre-charge signal PRC is supplied from the drive integrated circuit 200, via the pre-charge power supply line 115, to the pre-charge circuit 150. That is, the pre-charge power supply line 115 supplies the pre-charge signal PRC to the pre-charge circuit 150. The pre-charge control signals PSL[1] to PSL[8] are supplied from the drive integrated circuit 200, via the pre-charge control signal line 113, to the pre-charge circuit 150. That is, the pre-charge control signal line 113 supplies the pre-charge control signal PSL to the pre-charge circuit 150.

Note that, in the first embodiment, the signal lines 111 are divided into eight sequences, thus the number of the pre-charge control signal lines 113 is eight. The eight pre-charge control signal lines 113 are then divided into two groups, which are a first group GR1 and a second group GR2. In the example illustrated in FIG. 2, among the eight pre-charge control signal lines 113, four pre-charge control signal lines 113 in the first sequence, the third sequence, the fifth sequence, and the seventh sequence, which belong to the first group GR1, are arranged on an opposite side of the second direction D2 of the pre-charge circuit 150. Further, the four pre-charge control signal lines 113 in the second sequence, the fourth sequence, the sixth sequence, and the eighth sequence, which belong to the second group GR2, are arranged on a side of the second direction D2 of the pre-charge circuit 150. That is, in the example illustrated in FIG. 2, the pre-charge circuit 150 is provided between the pre-charge control signal line 113 that belongs to the first group GR1 and the pre-charge control signal line 113 that belongs to the second group GR2.

The pre-charge circuit 150 includes k pre-charge selection circuits 152[1] to 152[k] provided corresponding to the respective k signal line groups. The pre-charge selection circuits 152 each include eight pre-charge selection transistors 154[1] to 154[8] coupled to the respective eight signal lines 111 included in the corresponding signal line group. That is, the pre-charge selection transistor 154 is provided corresponding to the signal line 111. For example, one contacts of the respective eight pre-charge selection transistors 154[1] to 154[8] of a pre-charge selection circuit 152[i] are coupled to the respective eight signal lines 111 from the 8×i—7-th column to the 8×i-th column. The other contacts of the respective eight pre-charge selection transistors 154[1] to 154[8] of the pre-charge selection circuit 152[i], that is, the contacts that are not coupled to the signal line 111, are then commonly coupled to the pre-charge power supply line 115. The pre-charge power supply line 115 is coupled, via the flexible circuit board 300, to the drive integrated circuit 200.

The pre-charge selection transistors 154[1] to 154[8], in accordance with the pre-charge control signals PSL[1] to PSL[8], switch an electrical coupling state between the signal line 111 and the pre-charge power supply line 115, between the conductive state and the non-conductive state. For example, the pre-charge selection transistors 154[1] to 154[8] are N-channel transistors constituted by TFTs or the like, and are set to one of the conductive state or the non-conductive state in accordance with a level of the coupling control signal PCL received by a control terminal such as a gate. Note that the pre-charge selection transistors 154[1] to 154[8] may be switching elements other than TFTs. The pre-charge selection transistors 154[1] to 154[8] may also be P-channel transistors.

The pre-charge selection transistors 154[1] to 154[8] of the respective pre-charge selection circuits 152 receive the pre-charge control signals PSL[1] to PSL[8] via the pre-charge control signal line 113 from the drive integrated circuit 200. The pre-charge control signal line 113 is coupled, via the flexible circuit board 300, to the drive integrated circuit 200. The pre-charge control signals PSL[1] to PSL[8] each designate a start timing for outputting the pre-charge signal PRC to the signal line 111.

For example, when one pre-charge control signal PSL[1] is at a high level and the other seven pre-charge control signals PSL[2] to PSL[8] are at a low level, only the k pre-charge selection transistor 154[1] included in the respective k pre-charge selection circuits 152[1] to 152[k] are brought into the conductive state. Accordingly, the k pre-charge selection circuits 152[1] to 152[k] each output the pre-charge signal PRC supplied to the pre-charge power supply line 115 to the signal line 111 in the first sequence of the respective signal line groups. Hereinafter, similarly, the k pre-charge selection circuits 152[1] to 152[k] each output the pre-charge signal PRC supplied to the pre-charge power supply line 115 to the signal lines 111 in the second sequence, the third sequence, the fourth sequence, the fifth sequence, the sixth sequence, the seventh sequence, and the eighth sequence of the respective signal line groups. That is, the pre-charge selection transistor 154 supplies the pre-charge signal PRC to the corresponding signal line 111 in accordance with the pre-charge control signal PSL.

In the example illustrated in FIG. 2, the pre-charge selection transistors 154 in the first sequence, the third sequence, the fifth sequence, and the seventh sequence are provided on a side of the second direction D2 with reference to the pre-charge control signal line 113 that belongs to the first group GR1. Further, the pre-charge selection transistor 154 of the second sequence, the fourth sequence, the sixth sequence, and the eighth sequence are provided on an opposite side of the second direction D2 with reference to the pre-charge control signal line 113 that belongs to the second group GR2.

In the electro-optical panel 100 illustrated in FIG. 2, the pre-charge circuit 150 is disposed on the same side as the side on which the demultiplexer 140 is disposed, of the display region 120. In this case, the supply path of the pre-charge signal PRC from the terminal of the pre-charge power supply line 115 coupled to the drive integrated circuit 200 can be shortened compared to a case where the display region 120 is located between the demultiplexer 140 and the pre-charge circuit 150. This enables the supply path of the pre-charge signal PRC to be achieved by a low-resistance path, thus performing a pre-charge operation at a high rate of speed. Similarly, this enables shortening of the supply path of the pre-charge control signal PSL from the terminal of the pre-charge control signal line 113 coupled to the drive integrated circuit 200. This enables the supply path of the pre-charge control signal PSL to be achieved by a low-resistance path, thus performing a pre-charge operation at a high rate of speed.

Moreover, the pre-charge circuit 150 is disposed between the display region 120 and the demultiplexer 140. Such an arrangement, in which there is no intersection between the writing selection signal line 114 and the signal line 111, can suppress an increase in the parasitic capacitance of the writing selection signal line 114. Accordingly, such an arrangement, which can suppress an increase in the driving load of the writing selection signal line 114, achieves an arrangement suitable for a high-rate driving of the writing selection signal SL. Note that the signal line 111 crosses the pre-charge control signal line 113, however, crossing of the pre-charge control signal line 113 and the signal line 111 can reduce the effect on the high-rate writing to the pixel 122 compared to the crossing of the signal line 111 and the pre-charge control signal line 113 This is because, the transistor size of the writing selection transistor 142 is larger than the pre-charge selection transistor 154, and thus the line width of the writing selection signal line 114 is also designed to be wider than the pre-charge control signal line 113.

Further, because there is no intersection between the writing selection signal line 114 and the signal line 111, noises provided to the signal line 111 can be reduced when a writing of the image signal S is performed. This is because, the termination timing of writing of the image signal S to the pixel 122 is controlled based on the writing selection signal SL, and thus delaying the termination timing of writing than the termination timing of the pre-charge makes it possible to reduce the influence of the crossing of the signal line 111 and the pre-charge control signal line 113.

The inspection circuit 160, in an inspection operation for inspecting the n signal lines 111, performs an inspection of disconnection of the signal line 111 and short-circuiting of the respective signal lines 111 adjacent to each other. In the inspection operation, an electrical coupling state between the inspection circuit 160 and the n signal lines 111 is set to the conductive state. In the normal operation of displaying an image in accordance with the image signal S, the electrical coupling state between the inspection circuit 160 and the n signal lines 111 is set to the non-conductive state. Note that, in FIG. 2, an illustration of inspection pads for inspecting the signal lines 111 is omitted to make the figure easily viewable. In the electro-optical panel 100 illustrated in FIG. 2, the inspection circuit 160 is disposed on an opposite side of the second direction D2 of the display region 120.

The drive integrated circuit 200 synchronizes and controls the scanning line drive circuit 130, the demultiplexer 140, the pre-charge circuit 150, and the like. For example, the drive integrated circuit 200 outputs a control signal for controlling the operation of the scanning line drive circuit 130 to the scanning line drive circuit 130, outputs the writing selection signal SL to the demultiplexer 140, and outputs the pre-charge signal PRC and the pre-charge control signal PSL to the pre-charge circuit 150. The drive integrated circuit 200 also outputs the image signals S for eight pixels as a time-series serial signals to the respective demultiplexers 140. For example, the drive integrated circuit 200 sequentially outputs image signals S[1] to S[8] to the demultiplexer 140[1], and sequentially outputs image signals S[n-7] to S[n] to the demultiplexer 140[k]. The image signals S supplied to the signal lines 111 in an identical sequence are output in parallel from the drive integrated circuit 200 to the respective demultiplexers 140. That is, the drive integrated circuit 200 outputs, in parallel, the respective image signals S supplied to the signal lines 111 in an identical sequence to each of the plurality of signal line groups.

In the electro-optical panel 100 illustrated in FIG. 2, the signal lines 111 in the first sequence, the third sequence, the fifth sequence, and the seventh sequence are an example of the first signal line, and the signal lines 111 in the second sequence, the fourth sequence, the sixth sequence, and the eighth sequence are an example of the second signal line. Further, the pre-charge control signal lines 113 in the first sequence, the third sequence, the fifth sequence, and a seventh sequence, which belong to the first group GR1, are an example of the first pre-charge control signal line, and the pre-charge control signal lines 113 in the second sequence, the fourth sequence, the sixth sequence, and the eighth sequence, which belong to the second group GR2, are an example of the second pre-charge control signal line. Accordingly, the pre-charge control signal PSL supplied to the pre-charge circuit 150 via the pre-charge control signal line 113 that belongs to the first group GR1 is an example of the first pre-charge control signal, and the pre-charge control signal PSL supplied to the pre-charge circuit 150 via the pre-charge control signal line 113 that belongs to the second group GR2 is an example of the second pre-charge control signal.

Further, the pre-charge selection transistors 154 in the first sequence, the third sequence, the fifth sequence, and the seventh sequence are an example of the first switching unit, and the pre-charge selection transistors 154 in the second sequence, the fourth sequence, the sixth sequence, and the eighth sequence are an example of the second switching unit. The demultiplexer 140 is an example of a signal line driving circuit that supplies the image signal S to the plurality of the pixels 122. Note that the configuration of the electro-optical device 1 is not limited to the example illustrated in FIG. 2.

FIG. 3 is a circuit diagram illustrating a configuration of the pixel 122. The pixel 122 include a liquid crystal element 123, a holding capacitor 124, and a pixel transistor 125. The liquid crystal element 123 is an electro-optical element including a pixel electrode 123a and a common electrode 123b that face each other, and the liquid crystal 123c disposed between the pixel electrode 123a and the common electrode 123b. A display gradation changes due to a change in transmittance of the liquid crystal 123c in accordance with an applied voltage between the pixel electrode 123a and the common electrode 123b. Note that a common voltage Vcom being a constant voltage is supplied to the common electrode 123b via a non-illustrated common line.

The holding capacitor 124 is provided in parallel with the liquid crystal element 123. One terminal of the holding capacitor 124 is coupled to the pixel transistor 125, while the other terminal is coupled to the common electrode 123b via a non-illustrated capacitor line.

The pixel transistor 125, which is, for example, an N-channel transistor constituted by a TFT or the like, is provided between the liquid crystal element 123 and the signal line 111. The pixel transistor 125 is then set to one of the conductive state or the non-conductive state in accordance with a level of the scanning signal G supplied to the scanning line 110 coupled to a gate. That is, the pixel transistor 125 controls an electrical coupling between the liquid crystal element 123 and the signal line 111. For example, the scanning signal G[p] being set to the selected voltage allows the pixel transistors 125 in the respective pixels 122 in the p-th row to simultaneously or substantially simultaneously transit to the conductive state.

When the pixel transistor 125 is controlled to be the conductive state, the image signal S supplied from the signal line 111 is applied to the liquid crystal element 123. The liquid crystal 123c is set to a transmittance based on the image signal S by being applied with the image signal S. This allows the gradation of each of the pixels 122 to be set to a gradation designated by the image signal S. For example, when a non-illustrated light source becomes in a lighting-up state, light emitted from the light source passes through the liquid crystal 123c of the liquid crystal element 123 included in the pixel 122 to be output to an outside of the electro-optical device 1. That is, the image signal S being applied to the liquid crystal element 123, and the light source becoming in the lighting-up state, the pixel 122 displays a gradation based on the image signal S.

In addition, the holding capacitor 124 provided in parallel with the liquid crystal element 123 is charged to a voltage applied to the liquid crystal element 123. That is, each of the pixels 122 holds a potential corresponding to the image signal S in the holding capacitor 124.

Note that, in the electro-optical device 1, to prevent electrical deterioration of an electro-optical material, polarity inversion driving is employed in which a polarity of the voltage applied to the liquid crystal element 123 is inverted every predetermined period. For example, the electro-optical device 1 inverts a level of the image signal S to be supplied to the pixel 122 via the signal line 111 every one vertical scanning period with respect to a center voltage of the image signal S. Note that the period for inverting the polarity can be freely set, where, for example, the period may be set to a natural number multiple of the vertical scanning period. In the present specification, a polarity when the voltage of the image signal S is high with respect to a predetermined voltage such as a center voltage is referred to as positive polarity, and a polarity when the voltage of the image signal S is low with respect to the predetermined voltage is referred to as negative polarity.

Figure 4:
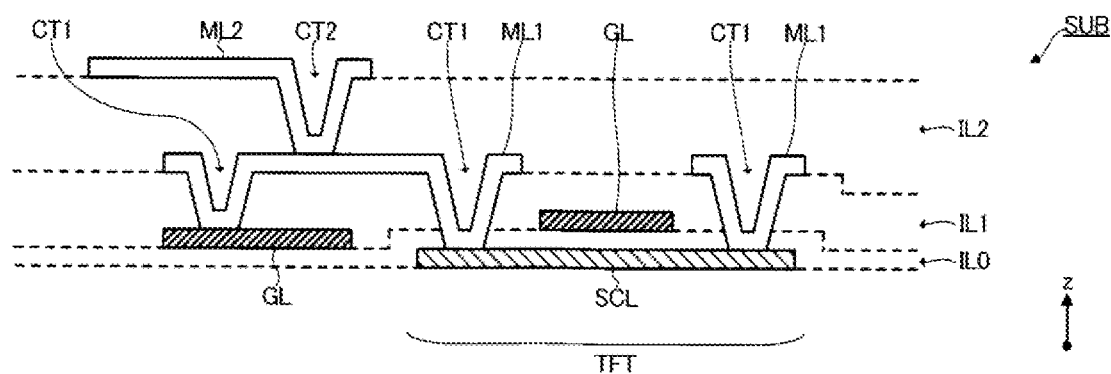
FIG. 4 is an explanatory view of a vertical structure of an electro-optical panel at an element substrate side.

FIG. 4 is an explanatory view of a vertical structure of the electro-optical panel 100 at an element substrate SUB side. The liquid crystal 123c, which is not illustrated in FIG. 4, is disposed on a side of z direction of the element substrate SUB. That is, the z-direction is the direction perpendicular to the image display surface. With reference to FIG. 4, a vertical structure of the electro-optical panel 100 at the element substrate SUB side is described, exemplifying a case where the side of the z direction is the upper side and the transistor such as the pre-charge selection transistor 154 is a TFT. Further, hereinafter, viewing from the z direction is referred to as "a plan view".

The element substrate SUB includes a semiconductor layer SCL, a gate insulating film IL0, a gate electrode wiring layer GL, a first interlayer insulating film IL1, a first contact hole CT1, a first wiring layer ML1, a second interlayer insulating film IL2, a second contact hole CT2, and a second wiring layer ML2. The semiconductor layer SCL is a semiconductor layer. For example, the semiconductor layer SCL includes the source and drain regions of the TFT. The gate insulating film IL0, which is an insulation layer, is disposed on the semiconductor layer SCL. The gate electrode wiring layer GL is disposed on the gate insulating film IL0. The gate electrode wiring layer GL disposed on the semiconductor layer SCL with the gate insulating film IL0 in between functions as a gate of the TFT. In the following descriptions, a gate of the transistor is also referred to as gate electrode. The first interlayer insulating film IL1, which is an insulation layer, is disposed on the gate electrode wiring layer GL. The first wiring layer ML1, which is an electric conductor layer, is disposed on the first interlayer insulating film IL1. The second interlayer insulating film IL2, which is an insulation layer, is disposed on the first wiring layer ML1. The second wiring layer ML2 is then disposed on the second interlayer insulating film IL2.

The first contact hole CT1 is a contact hole that passes through both the gate insulating film IL0 and the first interlayer insulating film IL1, or the first interlayer insulating film IL1. The region of the semiconductor layer SCL corresponding to the source and drain of the TFT is coupled to the first wiring layer ML1 via the first contact hole CT1 that passes through the gate insulating film IL0 and the first interlayer insulating film IL1. The gate electrode wiring layer GL is coupled to the first wiring layer ML1 via the first contact hole CT1 that passes through the first interlayer insulating film IL1. The second contact hole CT2 is a contact hole that passes through the second interlayer insulating film IL2. The first wiring layer ML1 is coupled to the second wiring layer ML2 via a second contact hole CT2 that passes through the second interlayer insulating film IL2.

Figure 5:
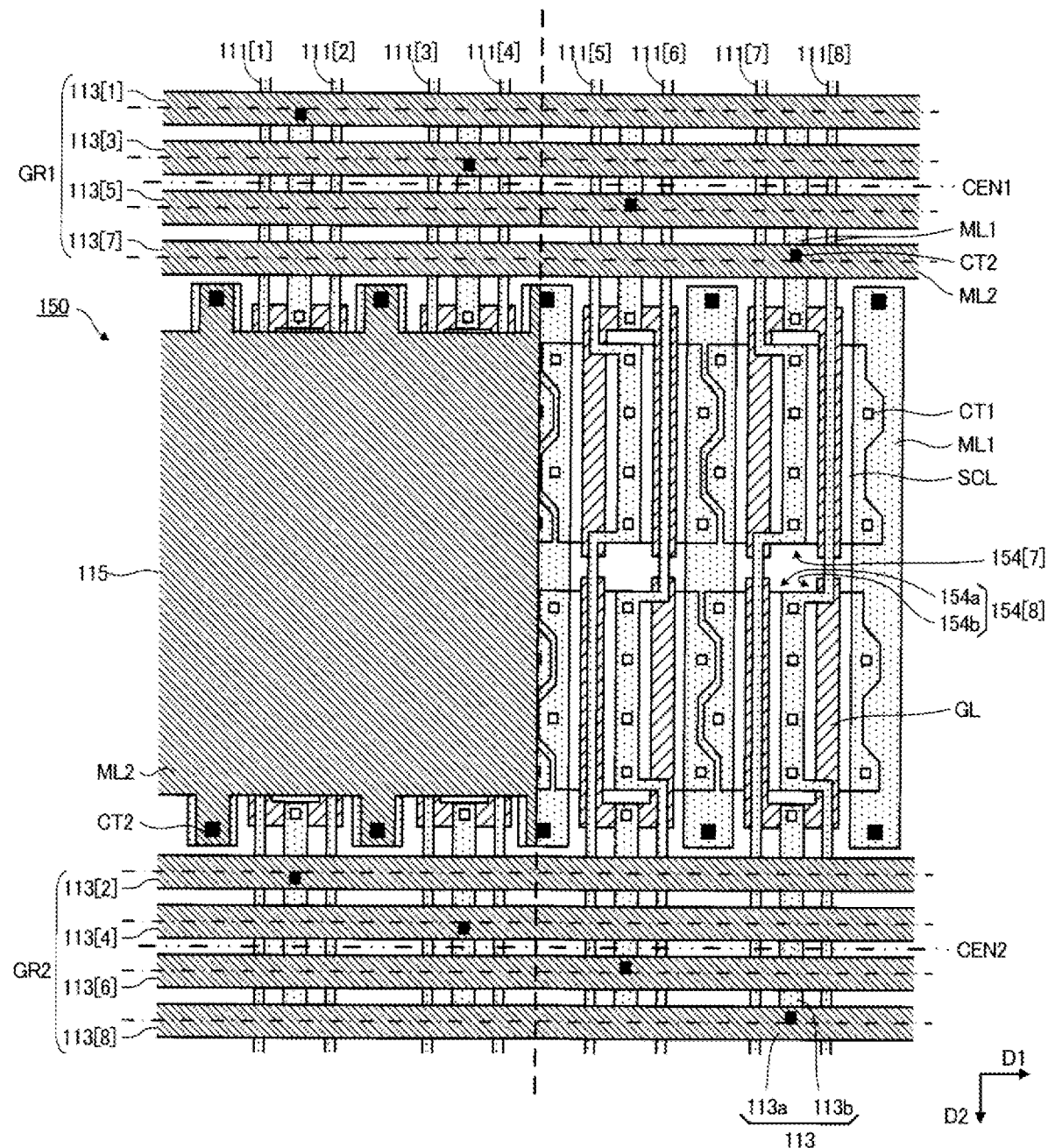
FIG. 5 is a plan view illustrating a layout of a pre-charge circuit and a periphery around the pre-charge circuit.

FIG. 5 is a plan view illustrating a layout of the pre-charge circuit 150 and the periphery around the pre-charge circuit 150. In FIG. 5, to make the configuration of the pre-charge selection transistor 154 easily viewable, the pre-charge power source line 115 on the right side from the dashed line in the figure is omitted to be illustrated, and the boundary of the semiconductor layer SCL at a position overlapping with the first wiring layer ML1 is illustrated. Further, the number within the square brackets of the signal line 111 and the pre-charge control signal line 113, which are indicated in FIG. 5, corresponds to the sequence number of the signal line 111. With reference to FIG. 5, descriptions will be given focusing on the characteristics of a layout of the pre-charge control signal lines 113 and the pre-charge selection transistors 154 according to the first embodiment.

In the first characteristics, the pre-charge control signal line 113[j] includes a main line 113a extending along the first direction D1, and a branch line 113b extending along the second direction D2 and coupling the main line 113a and a gate of the pre-charge selection transistor 154[j]. Note that j is a natural number from 1 to 8. For example, the second wiring layer ML2 is used for the main line 113a of the pre-charge control signal line 113, and the first wiring layer ML1 is used for the branch line 113b of the pre-charge control signal line 113. Further, the first wiring layer ML1 is used for the signal line 111 at a portion passing through the pre-charge control signal line 113 and the pre-charge circuit 150. This allows the signal line 111 to pass through the pre-charge control signal line 113 and the pre-charge circuit 150 without switching to the wirings of the second wiring layer ML2 and the like. The details of the pre-charge power supply line 115 will be described below, however, the use of the second wiring layer ML2 enables continuous wire connection from the signal line 111 of the writing selection transistor 142 of the non-illustrated demultiplexer 140 to the signal line 111 of the display region 120 using the first wiring layer ML1, which prevents an occurrence of defects due to contact failure or the like.

Further, although descriptions have been given with reference to FIG. 2, the pre-charge control signal lines 113[1] to 113[8] are divided into the first group GR1 in which the main line 113a is disposed on an opposite side of the second direction D2 of the pre-charge selection transistor 154 and the second group GR2 in which the main line 113a is disposed on a side of the second direction D2 of the pre-charge selection transistor 154. The pre-charge control signal lines 113[1], 113[3], 113[5], and 113[7] belong to the first group GR1, and the pre-charge control signal lines 113[2], 113[4], 113[6], and 113[8] belong to the second group GR2. The pre-charge circuit 150 is then provided between the main line 113a of the pre-charge control signal line 113 of the first group GR1 and the main line 113a of the pre-charge control signal line 113 of the second group GR2.

This allows a layout having the first characteristics to shorten the branch line 113b compared to a layout in which the pre-charge control signal PSL is input to the pre-charge circuit 150 only from one direction. For example, provided that q is a natural number from 1 to 4, in the layout in which the pre-charge control signal PSL is input to the pre-charge circuit 150 only from one direction, the main line 113a of a pre-charge control signal line 113[2q] is disposed between the main line 113a of a pre-charge control signal line 113[2q−1] and the pre-charge circuit 150. In this case, the branch line 113b of the pre-charge control signal line 113[2q] is elongated compared to the configuration of FIG. 5 by a distance corresponding to the width along the second direction D2 in a range in which the main line 113a of the pre-charge control signal line 113[2q] is located.

The electro-optical device 1 with the first characteristics, which can shorten the branch line 113b of the pre-charge control signal line 113 compared to the layout in which the pre-charge control signal PSL is input to the pre-charge circuit 150 only from one direction, can reduce the parasitic capacitance assuming a driving load of the pre-charge control signal line 113, to thus drive the pre-charge selection transistor 154 at a high rate of speed. Further, in the electro-optical device 1, the density of the branch lines 113b of the pre-charge control signal lines 113[1] to 113[8] assumes approximately half with respect to the layout in which the pre-charge control signal PSL is input to the pre-charge circuit 150 only from one direction, to thus enable the pre-charge selection transistors 154 and the like to be arranged in a narrow pitch.

In the second characteristics, the pre-charge power source line 115 extends along the first direction D1 over the region of the pre-charge selection transistor 154 in a plan view viewed from a direction perpendicular to the image display surface. For example, the second wiring layer ML2 is used for the pre-charge power supply line 115. The electro-optical device 1 with the second characteristics can reduce the area of a layout including the pre-charge circuit 150 and the periphery around the pre-charge circuit 150 compared to a layout in which the pre-charge power source line 115 is extended along the first direction D1 away from the region of the pre-charge selection transistor 154.

In the third characteristics, the shape of a pre-charge selection transistor 154[2q−1] when viewed from a side of the pre-charge control signal line 113[2q−1] is mutually similar to the shape of a pre-charge selection transistor 154[2q] when viewed from a side of the pre-charge control signal line 113[2q]. Thus, the electro-optical device 1, when performing a pre-charge operation, suppresses the deviation between the characteristics of the pre-charge selection transistor 154[2q−1] and the characteristics related to the pre-charge operation of the pre-charge selection transistor 154[2q] from becoming larger, to thus reduce variation among the signal lines 111 as the result of the pre-charge operation. This makes it possible to suppress an occurrence of display unevenness.

In the fourth characteristics, the pre-charge selection transistor 154 includes two transistors 154a and 154b coupled in parallel. The transistors 154b and 154b are arranged along the first direction D1. That is, a gate of the transistor 154a and a gate of the transistor 154b are arranged along the first direction D1. The transistors 154a and 154b has the region of the semiconductor layer SCL located between gates of the transistors 154a and 154b as a common drain coupled to the signal line 111. The sources of the transistors 154a and 154b are coupled, independently in the transistor 154a and the transistor 154b, to the pre-charge power supply line 115.

The layout having the fourth characteristics can shorten the pre-charge selection transistor 154 along the second direction D2 compared to a layout in which the transistors 154a and 154b included in the pre-charge selection transistor 154 are arranged along the second direction D2. Accordingly, the electro-optical device 1 can reduce the time constant due to the resistance and capacitance of the gate electrode compared to the layout in which the transistors 154a and 154b included in the pre-charge selection transistor 154 are arranged along the second direction D2, to thus drive the pre-charge selection transistor 154 at a high rate of speed.

In the fifth characteristics, the pre-charge selection transistor 154[2q] is disposed along the first direction D1 at a position on a side of the second direction D2 of the pre-charge selection transistor 154[2q−1] disposed along the first direction D1. The source of the transistor 154a included in one of the pre-charge selection transistors 154 adjacent to each other along the first direction D1 and the source of the transistor 154b included in the other are then separated from each other at the semiconductor layer SCL. A layout in which the semiconductor layer SCL of the pre-charge selection transistors 154 adjacent to each other is separated can suppress a breakage of the pre-charge selection transistor 154 due to charge accumulation during the manufacturing process compared to a layout in which the semiconductor layer SCL of the pre-charge selection transistors 154 adjacent to each other is not separated.

In the sixth characteristics, the pre-charge control signal lines 113[1] to 113[8] each include a second contact hole CT2 that couples the main line 113a and the branch line 113b at a position offset in the predetermined offset direction from the center of the width along the second direction D2. That is, in each of the pre-charge control signal lines 113[1] to 113[8], the branch line 113b is coupled to the main line 113a at a position offset in the predetermined offset direction from the center of the width, along the second direction D2, of the main line 113a. The predetermined offset direction of the pre-charge control signal line 113[2q−1] that belongs to the first group GR1 is a direction toward the center CEN1 of the width along the second direction D2 in a range in which the main line 113a of the first group GR1 disposed along the second direction D2 is located. Further, the predetermined offset direction of the pre-charge control signal line 113[2q] that belongs to the second group GR2 is a direction toward the center CEN2 of the width along the second direction D2 in a range in which the main line 113a of the second group GR2 disposed along the second direction D2 is located. Note that the dot-dash line in FIG. 5 indicates the center of the width, along the second direction D2, of the main line 113a of the pre-charge control signal line 113, and the two-dot chain line in FIG. 5 indicates the centers CENT and CEN2 of the width along the second direction D2 in a range in which the main line 113a disposed along the second direction D2 is located.

The electro-optical device 1 with the sixth characteristics can reduce the difference, among the pre-charge control signal lines 113, of the length of the branch line 113b from the second contact hole CT2 to the gate electrode compared to a configuration in which the second contact hole CT2 coupling the main line 113a and the branch line 113b is disposed at the center of the width, along the second direction D2, of the main line 113a of the pre-charge control signal line 113. This allows for the reduction of the difference, among the pre-charge control signal lines 113, in the wiring resistance of the branch line 113b from the second contact hole CT2 to the gate electrode. The effect of the reduction of the difference, among the pre-charge control signal lines 113, in the wiring resistance of the branch line 113b is enhanced as the width, along the second direction D2, of the main line 113a of the pre-charge control signal line 113 increases. Further, in the configuration in which the gate electrode wiring layer GL is used for the branch line 113b, the gate electrode wiring layer GL having higher resistance than the first wiring layer ML1 causes the effect of the reduction of the difference, among the pre-charge control signal lines 113, in the wiring resistance of the branch line 113b to be further enhanced.

Note that the difference, among the pre-charge control signal lines 113, in the wiring resistance of the branch line 113b can also be reduced by simply changing the width of the branch line 113b. However, in a configuration in which the width of the branch line 113b is changed, the signal line 111 disposed on both sides of the branch line 113b causes a difference in the parasitic capacitance of the signal line 111 to occur among the signal lines 111 due to the difference in distance between the signal line 111 and the branch line 113b, to possibly cause a display failure. In contrast, the electro-optical device 1 with the sixth characteristic described above, which has the width of the branch line 113b approximately equal to the width of the other branch lines 113b, can reduce the difference, among the pre-charge control signal lines 113, in the wiring resistance of the branch line 113b, while suppressing an occurrence of the difference in the parasitic capacitances of the plurality of signal lines 111.

In the example illustrated in FIG. 5, the main line 113a of the pre-charge control signal line 113[2q−1] that belongs to the first group GR1 is an example of the first main line, and the branch line 113b of the pre-charge control signal line 113[2q−1] that belongs to the first group GR1 is an example of a first branch line. Further, the main line 113a of the pre-charge control signal line 113[2q] that belongs to the second group GR2 is an example of the second main line, and the branch line 113b of the pre-charge control signal line 113[2q] that belongs to the second group GR2 is an example of a second branch. Further, the transistors 154a and 154b of the pre-charge selection transistor 154[2q−1] are an example of a first transistor, and the transistors 154a and 154b of the pre-charge selection transistor 154[2q] are an example of a second transistor. Moreover, the predetermined offset direction of the pre-charge control signal line 113[2q−1] that belongs to the first group GR1 is an example of a first offset direction, and the predetermined offset direction of the pre-charge control signal line 113[2q] that belongs to the second group GR2 is an example of a second offset direction.

Note that the layout of the pre-charge circuit 150 and the periphery around the pre-charge circuit 150 is, but not limited to, the example illustrated in FIG. 5. For example, the pre-charge circuit 150, the pre-charge control signal line 113, and the like may be laid out employing any one or a plurality of the first characteristics to sixth characteristics that are described above.

Figure 6:
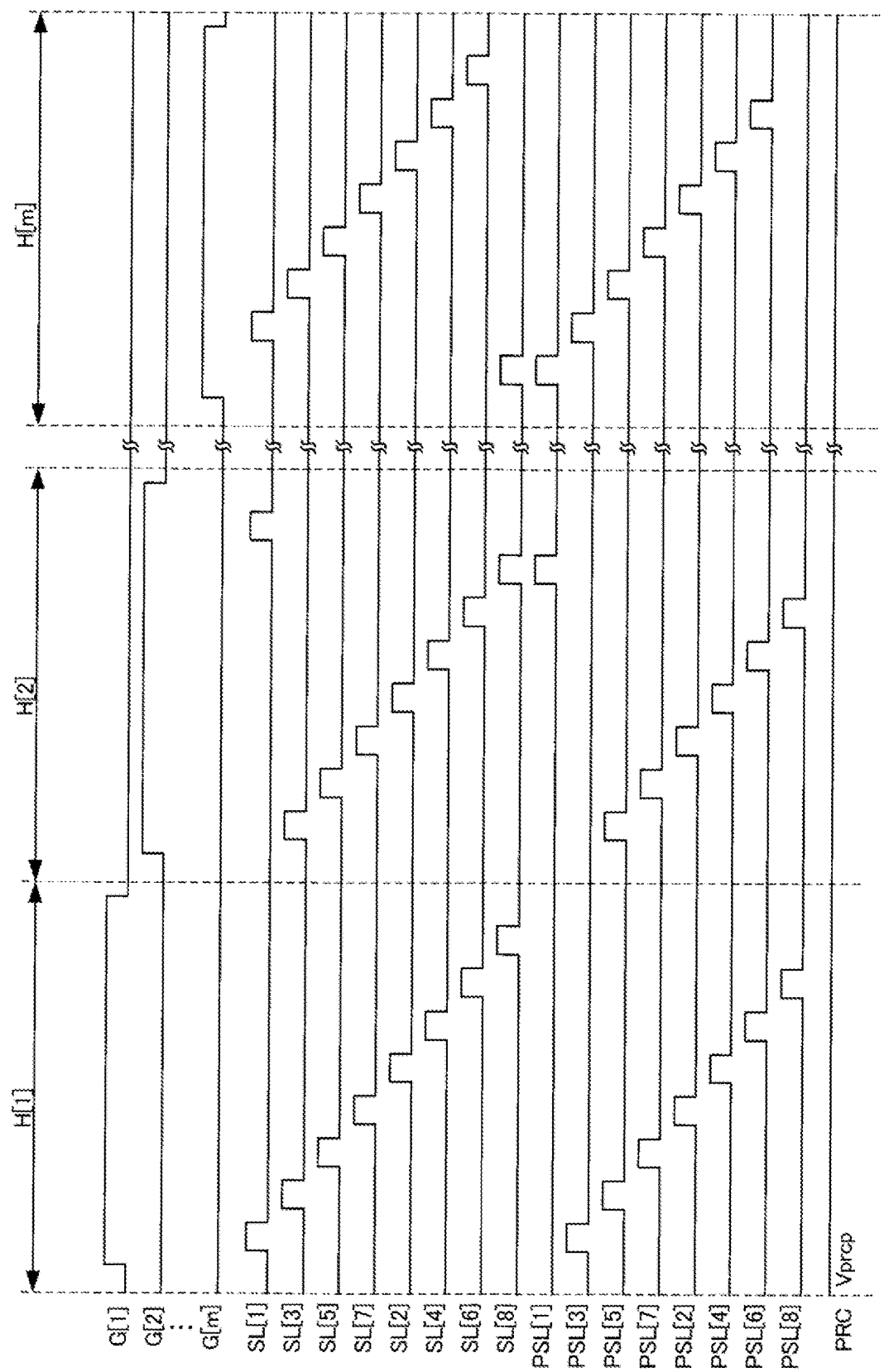
FIG. 6 is a chart illustrating an example of operation timings of an electro-optical device.

FIG. 6 is a chart illustrating an example of operation timings of the electro-optical device 1. Note that FIG. 6 illustrates the operation timings of normal operation of the respective horizontal scanning periods H in the positive polarity driving. In the positive polarity driving, the pre-charge voltage Vprcp is supplied as a pre-charge signal PRC to the pre-charge power supply line 115.

The horizontal scanning period H[1] is a horizontal scanning period H for writing a video voltage based on the image signal S to the first pixel 122. In the horizontal scanning period H[1], the scanning signal G[1] to be supplied to the scanning line 110 in the first row is set to a high level. The scanning signals G[2] to G[m] to be supplied to the scanning lines 120 in rows other than the first row are maintained at a low level. For example, each of the high level periods of writing selection signals SL[1] to SL[8] is switched according to the order of the writing selection signals SL[1], SL[3], SL[5], SL[7], SL[2], SL[4], SL[6], and SL[8]. That is, the writing period of the image signal S is sequentially allocated to the signal lines 111 in the respective sequences from the signal line 111 in the first sequence to the signal line 111 in the eighth sequence. This allows the signal lines 111 in the respective sequences to be sequentially supplied with the image signal S.

Further, each of the high level periods of the pre-charge control signals PSL[3], PSL[5], PSL[7], PSL[2], PSL[4], PSL[6], and PSL[8] is switched in conjunction with the switching of each of the high level periods of the writing selection signals SL[1], SL[3], SL[5], SL[7], SL[2], SL[4], and SL[6]. That is, each of the high level periods of the pre-charge control signals PSL[2] to PSL[8] is switched according to the order of the pre-charge control signals PSL[3], PSL[5], PSL[7], PSL[2], PSL[4], PSL[6], and PSL[8].

For example, the pre-charge control signal PSL[3] is transitioned to the high level in synchronization with the timing when the writing selection signal SL[1] is transitioned to the high level, and is then transitioned to a low level after an elapse of a prescribed time period. During the pre-charge period of the third sequence in which the pre-charge control signal PSL[3] is maintained at the high level, a pre-charge operation is performed to the signal line 111 in the third sequence. That is, the pre-charge signal PRC is supplied to the signal line 111 in the third sequence in the pre-charge period of the third sequence. Thus, the signal line 111 in the third sequence is charged to the pre-charge voltage Vprcp of positive polarity based on the pre-charge signal PRC. Note that in the horizontal scanning period H[1], the pre-charge control signal PSL[1] is maintained at the low level.

In the horizontal scanning period H[2], the scanning signal G[2] to be supplied to the scanning line 110 in the second row is set to the high level, while the scanning signal G to be supplied to the scanning lines 110 in rows other than the second row is maintained at the low level. The horizontal scanning period H[2] is different from the horizontal scanning period H[1] in the order when the image signal S is sequentially supplied to the signal lines 111 in the respective sequences from the first sequence to the eighth sequence. For example, each of the high level periods of the writing selection signals SL[1] to SL[8] is switched according to the order of the writing selection signals SL[3], SL[5], SL[7], SL[2], SL[4], SL[6], SL[8], and SL[1]. Further, each of the high level periods of the pre-charge control signals PSL[5], PSL[7], PSL[2], PSL[4], PSL[6], PSL[8], and PSL[1] is switched in conjunction with the switching of each of the high level periods of the writing selection signals SL[3], SL[5], SL[7], SL[2], SL[4], SL[6], and SL[8]. Note that in the horizontal scanning period H[2], the pre-charge control signal PSL[3] is maintained at the low level.

In the horizontal scanning period H[m], a potential of the scanning signal G[m] to be supplied to the scanning line 110 in the m-th row is set to the high level, while the scanning signal G to be supplied to the scanning lines 110 in rows other than the m-th row is maintained at the low level. In the example illustrated in FIG. 6, m is a multiple number of eight. The horizontal scanning period H[m] is different from the horizontal scanning period H[1] in the order when the image signal S is sequentially supplied to the signal lines 111 in the respective sequences from the first sequence to the eighth sequence. For example, each of the high level periods of the writing selection signals SL[1] to SL[8] is switched according to the order of the writing selection signals SL[8], SL[1], SL[3], SL[5], SL[7], SL[2], SL[4], and SL[6]. Further, each of the high level periods of the pre-charge control signals PSL[1], PSL[3], PSL[5], PSL[7], PSL[2], PSL[4], and PSL[6] is switched in conjunction with the switching of each of the high level periods of the writing selection signals SL[8], SL[1], SL[3], SL[5], SL[7], SL[2], and SL[4]. Note that in the horizontal scanning period H[m], the pre-charge control signal PSL[8] is maintained at the low level.

In the example illustrated in FIG. 6, the sequence of the signal line 111 in which a pre-charge operation is not performed is changed for each of the horizontal scanning periods H to loop in eight horizontal scanning periods H. In the electro-optical device 1, rotating the sequence of the signal line 111 in which a pre-charge is not performed enables the number of pre-charge operations to the signal lines 111 in the respective sequences to be made uniform, thus suppressing the reduction in image quality.

Note that the operation timings of the electro-optical device 1 are, but not limited to, the example illustrated in FIG. 6. For example, the order in which the image signal S is supplied to the signal lines 111 in the respective sequences may be an order different from the order illustrated in FIG. 6.

In the first embodiment, as described above, the pre-charge circuit 150 includes a pre-charge selection transistor 154 that supplies the pre-charge signal PRC to the signal line 111 in accordance with the pre-charge control signal PSL. The pre-charge selection transistors 154[1], 154[3], 154[5], and 154[7] are provided on a side of the second direction D2 with reference to the pre-charge control signal lines 113[1], 113[3], 113[5], and 113[7]. The pre-charge selection transistors 154[2], 154[4], 154[6], and 154[8] are provided on an opposite side of the second direction D2 with reference to the pre-charge control signal lines 113[2], 113[4], 113[6], and 113[8].

That is, the pre-charge circuit 150 includes a pre-charge selection transistor 154 to which the pre-charge control signal PSL is input from an opposite side of the second direction D2, and a pre-charge selection transistor 154 to which the pre-charge control signal PSL is input from a side of the second direction D2. Thus, in the first embodiment, the branch line 113b coupling the main line 113a of the pre-charge control signal line 113 and a gate of the pre-charge selection transistor 154 can be shortened compared to the layout in which the pre-charge control signal PSL is input to the pre-charge circuit 150 only from one direction. In the first embodiment, this allows for the reduction of the parasitic capacitance serving as a driving load of the pre-charge control signal line 113, to thus drive the pre-charge selection transistor 154 at a high rate of speed.

The pre-charge power source line 115 extends along the first direction D1 over the region of the pre-charge selection transistor 154 in a plan view viewed from a direction perpendicular to the image display surface. In this case, the area of the layout including the pre-charge circuit 150 and the periphery around the pre-charge circuit 150 can be reduced compared to a layout in which the pre-charge power supply line 115 is extended along the first direction D1 away from the region of the pre-charge selection transistor 154.

Moreover, provided that q is a natural number from 1 to 4, the shape of the pre-charge selection transistor 154[2q−1] when viewed from a side of the pre-charge control signal line 113[2q−1] is mutually similar to the shape of the pre-charge selection transistor 154[2q] when viewed from a side of the pre-charge control signal line 113[2q]. In this case, the deviation between the characteristics of the pre-charge selection transistor 154[2q−1] and the characteristics of the pre-charge selection transistor 154[2q] can be suppressed from becoming larger, to reduce variation among the signal lines 111 as the result of the pre-charge operation. This makes it possible to suppress an occurrence of display unevenness.

The pre-charge selection transistors 154[1] to[8] each include two transistors 154a and 154b disposed along the first direction D1 and coupled in parallel. The transistors 154a and 154b have the region of the semiconductor layer SCL located between gates of the transistors 154a and 154b as a common drain coupled to the signal line 111. In this case, the length along the second direction D2 of the pre-charge selection transistor 154 can be shortened compared to the layout in which the transistors 154a and 154b included in the pre-charge selection transistor 154 are arranged along the second direction D2. This allows for the reduction of the time constant due to the resistance and capacitance of the gate electrode compared to the layout in which the transistors 154a and 154b included in the pre-charge selection transistor 154 are arranged along the second direction D2, to thus drive the pre-charge selection transistor 154 at a high rate of speed.

The source of the transistor 154a included in one of the pre-charge selection transistors 154 adjacent to each other along the first direction D1 and the source of the transistor 154b included in the other are separated from each other at the semiconductor layer SCL. In this case, a breakage of the pre-charge selection transistor 154 due to charge accumulation during the manufacturing process can be suppressed compared to a configuration in which the semiconductor layer SCL of the pre-charge selection transistors 154 adjacent to each other is not separated.

In addition, the pre-charge control signal lines 113[1] to 113[8] each include a second contact hole CT2 that couples the main line 113a and the branch line 113b at a position offset in the predetermined offset direction from the center of the width, along the second direction D2, of the main line 113a. The predetermined offset direction of the pre-charge control signal line 113[2q−1] that belongs to the first group GR1 is a direction toward the center CENT of the width along the second direction D2 in a range in which the main line 113a of the first group GR1 disposed along the second direction D2 is located. Further, the predetermined offset direction of the pre-charge control signal line 113[2q] that belongs to the second group GR2 is a direction toward the center CEN2 of the width along the second direction D2 in a range in which the main line 113a of the second group GR2 disposed along the second direction D2 is located.

By disposing the second contact hole CT2 that couples the main line 113a and the branch line 113b at a position offset in a predetermined offset direction from the center of the main line 113a of the pre-charge control signal line 113, the difference, among the pre-charge control signal lines 113, of the length of the branch line 113b from the second contact hole CT2 to the gate electrode of the pre-charge selection transistor 154 can be reduced. This allows for the reduction of the difference, among the pre-charge control signal lines 113, in the wiring resistance of the branch line 113b from the second contact hole CT2 to the gate electrode.

Second Embodiment

The main differences between the second embodiment and the first embodiment lie in the layout of the wirings that couple the drains of the pre-charge selection transistors 154 and the signal lines 111.

Figure 7:
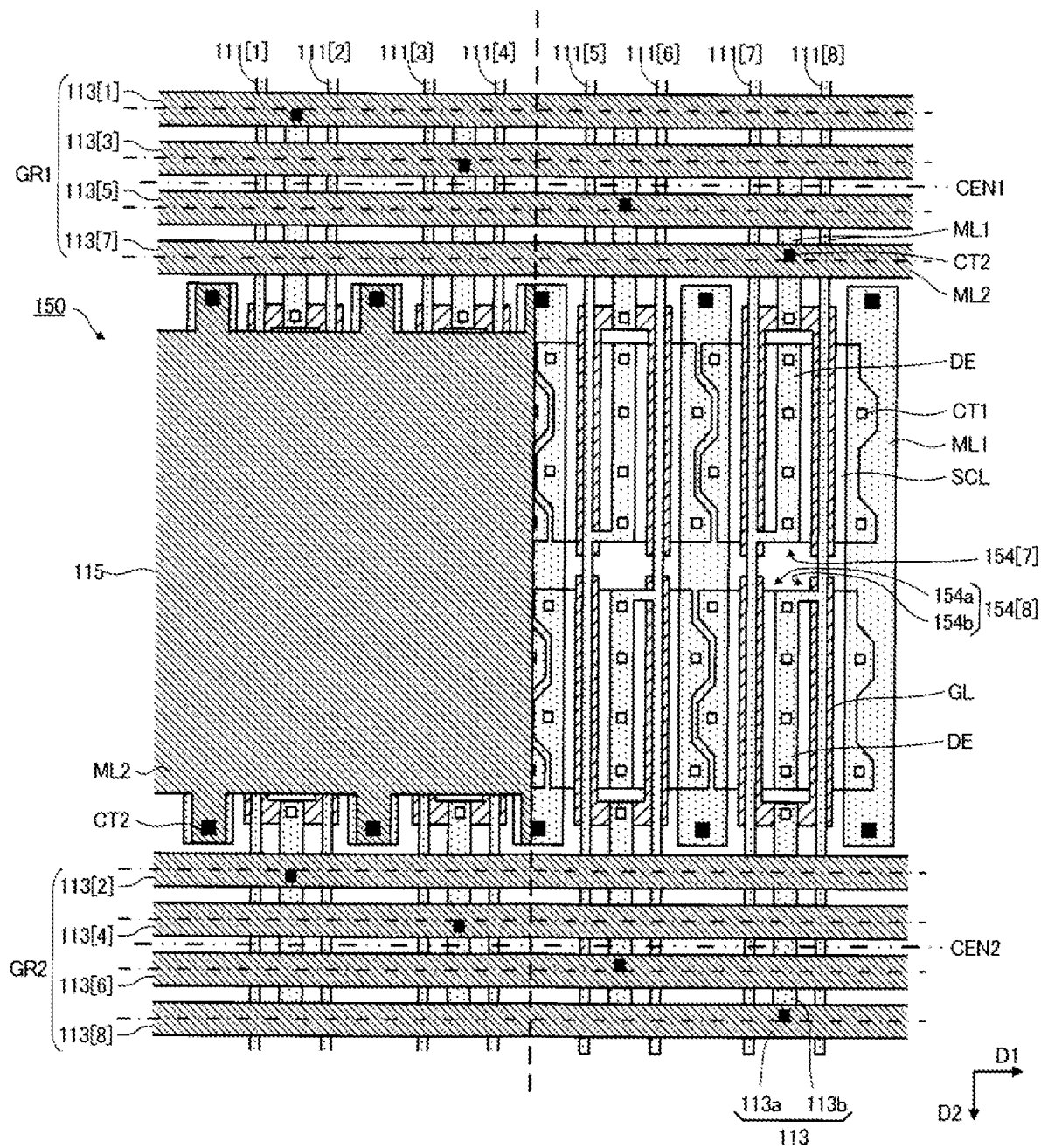
FIG. 7 is a plan view illustrating a layout of a pre-charge circuit and a periphery around the pre-charge circuit according to a second embodiment.

FIG. 7 is a plan view illustrating a layout of the pre-charge circuit 150 and the periphery around the pre-charge circuit 150 according to the second embodiment. Elements that are the same as those described with reference to FIGS. 1 to 6 are given the same reference signs, and detailed descriptions thereof will be omitted. In FIG. 7, as in FIG. 5, to make the configuration of the pre-charge selection transistor 154 easily viewable, the pre-charge power source line 115 on the right side from the dashed line in the figure is omitted to be illustrated, and the boundary of the semiconductor layer SCL at a position overlapping with the first wiring layer ML1 is illustrated.

The electro-optical device 1 according to the second embodiment is the same as the electro-optical device 1 in FIG. 1, except for the layout of the wirings that couple the drains of the pre-charge selection transistors 154 and the signal lines 111. For example, the electro-optical device 1 according to the second embodiment includes an electro-optical panel 100, a drive integrated circuit 200, and a flexible circuit board 300. Note that the electro-optical panel 100 according to the second embodiment is the same as the electro-optical panel 100 in FIG. 2, except for the layout of the wirings that couple the drains of the pre-charge selection transistors 154 and the signal lines 111. With reference to FIG. 7, descriptions will be given focusing on the layout of the wirings that couple the drains of the pre-charge selection transistors 154 and the signal lines 111, which is a difference between the second embodiment and the first embodiment.

The pre-charge selection transistors 154[2], 154[4], 154[6], and 154[8] are arranged on a side of the second direction D2 of the pre-charge selection transistors 154[1], 154[3], 154[5], and 154[7]. Further, the transistors 154a and 154b included in the respective pre-charge selection transistors 154 have a drain electrode DE disposed on the region of the semiconductor layer SCL corresponding to the drain of the transistors 154a and 154b. Note that the first wiring layer ML1, which is the same wiring layer as the signal line 111, is used for the drain electrode DE.

The drain electrode DE of the transistors 154a and 154b included in the pre-charge selection transistor 154[2q-1] is coupled to the signal line 111 at the end portion on a side of the drain electrode DE of the transistors 154a and 154b included in the pre-charge selection transistor 154[2q]. Further, the drain electrode DE of the transistors 154a and 154b included in the pre-charge selection transistor 154[2q] are coupled to the signal line 111 at the end portion on a side of the drain electrode DE of the transistors 154a and 154b included in the pre-charge selection transistor 154[2q-1].

That is, the drain electrode DE of one pre-charge selection transistor 154 of the two pre-charge selection transistors 154 adjacent to each other along the second direction D2 is coupled to the signal line 111 at the end portion on a side of the drain electrode DE of the other pre-charge selection transistor 154. In this case, the difference, among the n signal lines 111, in the distance from the drain electrode DE of the pre-charge selection transistor 154 to the pixel 122 in the m-th row can be reduced compared to the layout of FIG. 5. That is, the difference, among the n signal lines 111, in the wiring resistance of the signal line 111 from the drain electrode DE of the pre-charge selection transistor 154 to the pixel 122 in the m-th row can be reduced. This allows for the reduction of the difference, among the n signal lines 111, of the potential variation of the signal line 111 due to pre-charge operation, to make it possible to suppress an occurrence of display unevenness.

In the example illustrated in FIG. 7, the drain electrodes DE of the transistors 154a and 154b included in the pre-charge selection transistor 154[2q-1] are an example of the first drain electrode, and the drain electrodes DE of the transistors 154a and 154b included in the pre-charge selection transistor 154[2q] are an example of the second drain electrode.

In the above-described second embodiment as well, advantages as in the first embodiment can be obtained. In the second embodiment, the drain electrode DE of one pre-charge selection transistors 154 of the two pre-charge selection transistors 154 adjacent to each other along the second direction D2 is coupled to the signal line 111 at the end portion on a side of the drain electrode DE of the other pre-charge selection transistor 154. This allows for the reduction of the difference, among the n signal lines 111, in the wiring resistance of the signal line 111 from the drain electrode DE of the pre-charge selection transistor 154 to the pixel 122 in the m-th row. This allows for the reduction of the difference, among the n signal lines 111, of the potential variation of the signal line 111 due to pre-charge operation, to make it possible to suppress an occurrence of display unevenness.

Third Embodiment

The main difference between the third embodiment and the first embodiment is that the two pre-charge selection transistors 154 are arranged along the first direction D1 such that the drains thereof face each other.

Figure 8:
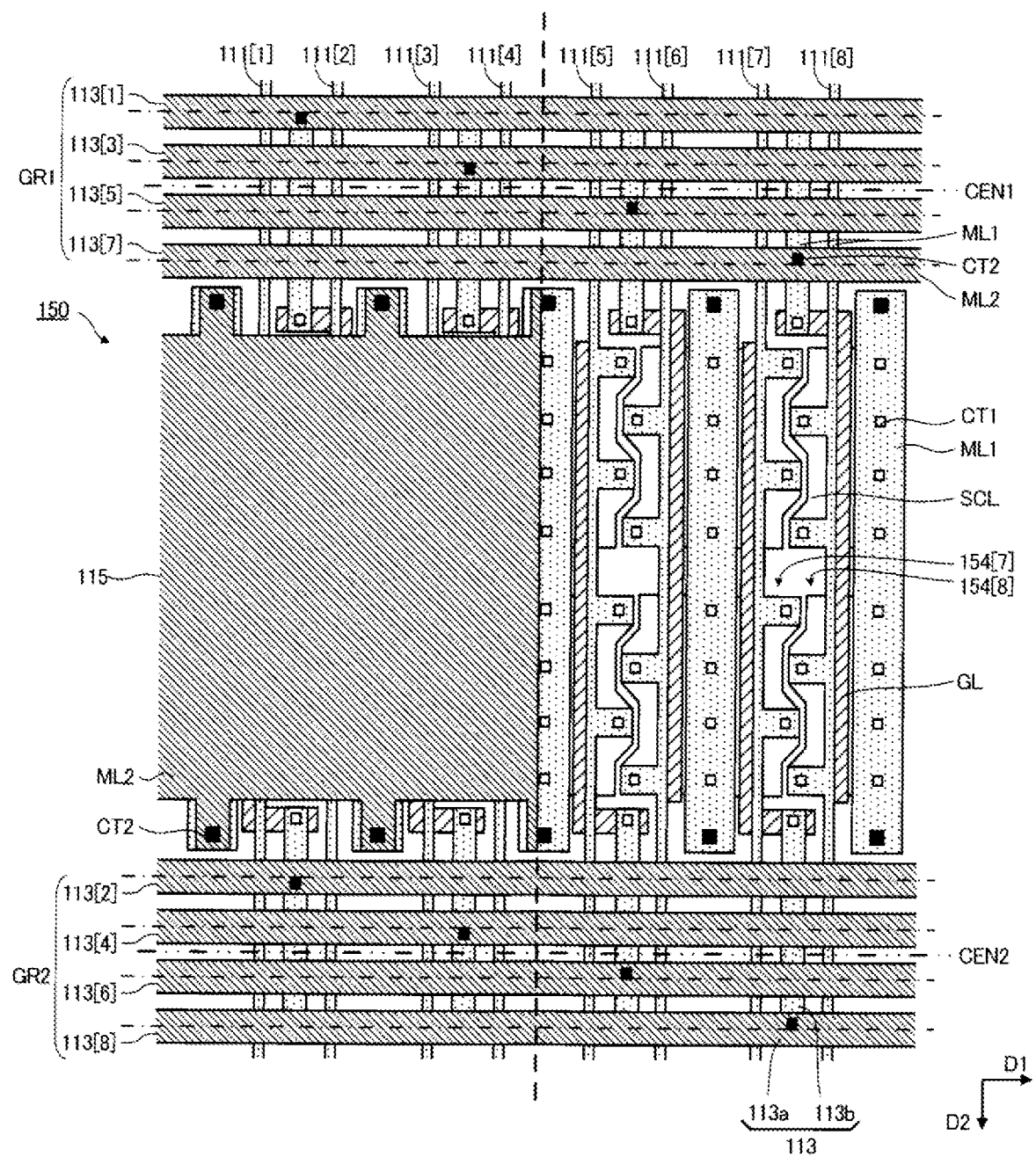
FIG. 8 is a plan view illustrating a layout of a pre-charge circuit and a periphery around the pre-charge circuit according to a third embodiment.

FIG. 8 is a plan view illustrating a layout of the pre-charge circuit 150 and the periphery around the pre-charge circuit 150 according to the third embodiment. Elements that are the same as those described with reference to FIGS. 1 to 7 are given the same reference signs, and detailed descriptions thereof will be omitted. In FIG. 8 as well, to make the configuration of the pre-charge selection transistor 154 easily viewable, the pre-charge power supply line 115 on the right side from the dashed line in the figure is omitted to be illustrated.

The electro-optical device 1 according to the third embodiment is the same as the electro-optical device 1 in FIG. 1, except for the layout of the pre-charge selection transistor 154. The electro-optical device 1 according to the third embodiment includes an electro-optical panel 100, a drive integrated circuit 200, and a flexible circuit board 300. Note that the electro-optical panel 100 according to the third embodiment is the same as the electro-optical panel 100 in FIG. 2, except for the layout of the pre-charge selection transistor 154. With reference to FIG. 8, descriptions will be given focusing on the layout of the pre-charge selection transistor 154, which is a difference between the third embodiment and the first embodiment.

The pre-charge selection transistor 154[2q−1] and the pre-charge selection transistor 154[2q] are arranged along the first direction D1 such that the drains thereof face each other. The signal line 111 coupled to the drain of the pre-charge selection transistor 154[2q−1] is then disposed at a position where the distance from a drain of the pre-charge selection transistor 154[2q] becomes greater than the distance from a gate of the pre-charge selection transistor 154[2q−1]. Further, the signal line 111 coupled to the drain of the pre-charge selection transistor 154[2q] is disposed at a position where the distance from a drain of the pre-charge selection transistor 154[2q−1] becomes greater than the distance from a gate of the pre-charge selection transistor 154[2q]. In the example illustrated in FIG. 8, the signal line 111 extends along the second direction D2 over the gate of the pre-charge selection transistor 154 in a plan view viewed from a direction perpendicular to the image display surface.

Thus, in the example illustrated in FIG. 8, the spacing between the first wiring layers ML1 used for the signal line 111 can be expanded compared to a layout in which the signal line 111 extends over the drain at a position away from the gate of the pre-charge selection transistor 154. In other words, the design rule of the first wiring layer ML1 is mitigated. This allows the pre-charge selection transistor 154 and the like to be arranged at a narrow pitch compared to the layout in which the signal line 111 extends over the drain at a position away from the gate of the pre-charge selection transistor 154.

Note that, in a layout in which the gate electrode of the pre-charge selection transistor 154 overlaps with the signal line 111, the parasitic capacitance between the gate electrode and the signal line 111 becomes greater than a layout in which the gate electrode does not overlap with the signal line 111. Accordingly, a feedthrough voltage caused by switching the pre-charge selection transistor 154 between the conductive state and the non-conductive state becomes greater than the layout in which the gate electrode does not overlap with the signal line 111. However, the increase in the feedthrough voltage due to the switching of the state of the pre-charge selection transistor 154 is an event associated with a pre-charge operation, and is not an increase in the feedthrough voltage accompanying the writing of the image signal S.

Thus, the increase in the feedthrough voltage due to the switching of the state of the pre-charge selection transistor 154 does not provide adverse effects such as a voltage range increase or the like of the image signal S output by the drive integrated circuit 200. That is, in the layout illustrated in FIG. 8, the pre-charge selection transistor 154 and the like can be arranged at a narrow pitch while suppressing an occurrence of adverse effects such as a voltage range increase of the image signal S output by the drive integrated circuit 200.

In the example illustrated in FIG. 8, the pre-charge selection transistor 154[2q−1] is an example of the first switching unit and the first transistor, and the pre-charge selection transistor 154[2q] is an example of the second switching unit and the second transistor.

In the above-described third embodiment as well, advantages as in the first embodiment can be obtained except for the advantages obtained by the gate of the transistor 154a and the gate of the transistor 154b being arranged along the first direction D1. Further, in the third embodiment, the signal line 111 extends along the second direction D2 over the gate of the pre-charge selection transistor 154 in a plan view viewed from a direction perpendicular to the image display surface. Accordingly, in the third embodiment, the spacing between the first wiring layers ML1 used for the signal line 111 can be expanded compared to the layout in which the signal line 111 extends over the drain at a position away from the gate of the pre-charge selection transistor 154. This allows the pre-charge selection transistor 154 and the like to be disposed at a narrow pitch.

Modifications

Each of the embodiments from the first embodiment to third embodiment can be variously modified. Specific modification aspects are exemplified below. Two or more aspects freely selected from exemplifications below can be appropriately combined as long as mutual contradiction does not arise.

Modification 1

Figure 9:
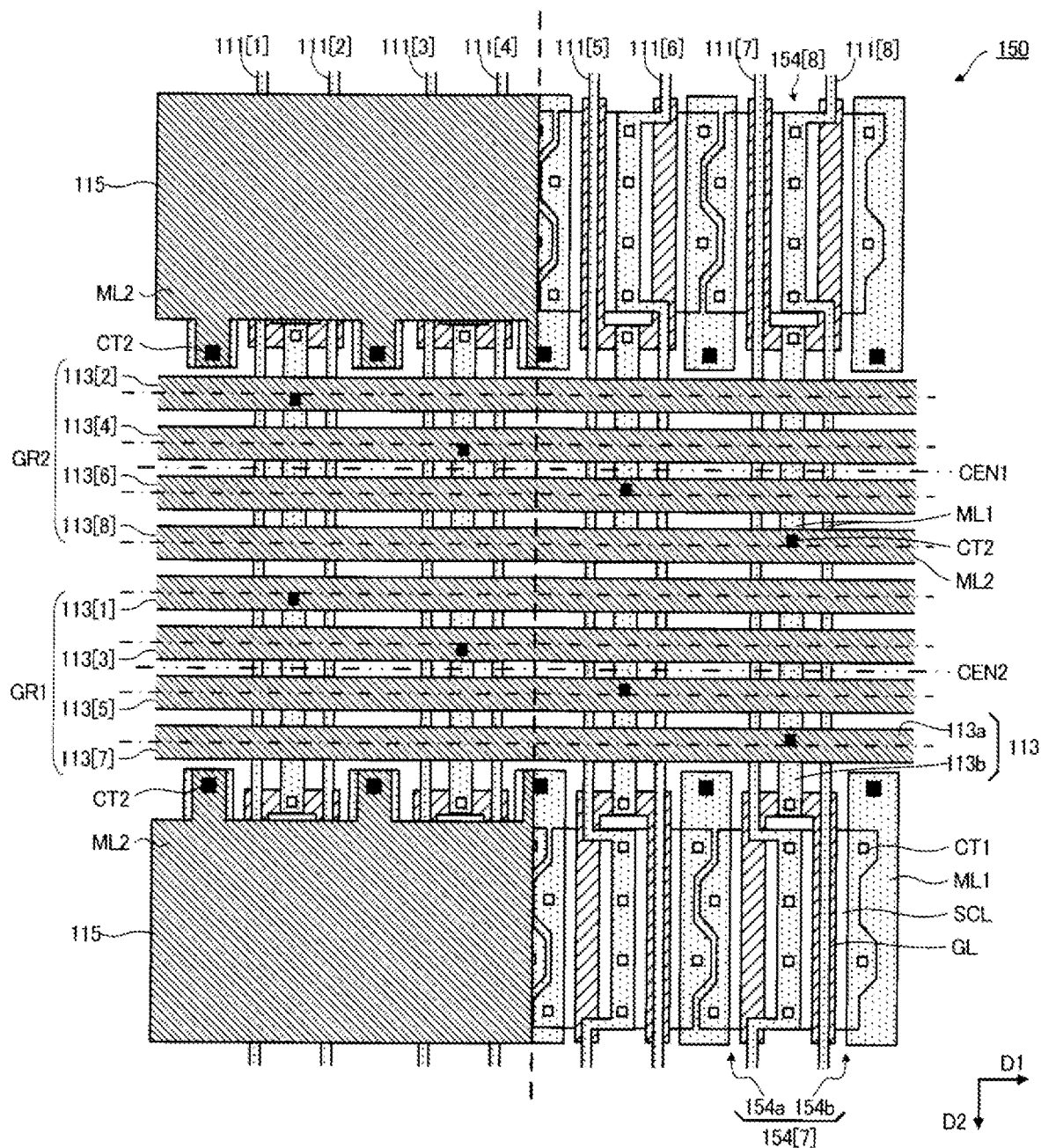
FIG. 9 is a plan view illustrating a layout of a pre-charge circuit and a periphery around the pre-charge circuit according to a modification 1.

In each of the embodiments from the first embodiment to third embodiment, the pre-charge control signal line 113 may be disposed between the pre-charge selection transistor 154[2q−1] and the pre-charge selection transistor 154[2q], as illustrated in FIG. 9.

FIG. 9 is a plan view illustrating a layout of the pre-charge circuit 150 and the periphery around the pre-charge circuit 150 according to the modification 1. Elements that are the same as those described with reference to FIGS. 1 to 8 are given the same reference signs, and detailed descriptions thereof will be omitted. In FIG. 9, as in FIG. 5, to make the configuration of the pre-charge selection transistor 154 easily viewable, the pre-charge power source line 115 on the right side from the dashed line in the figure is omitted to be illustrated, and the boundary of the semiconductor layer SCL at a position overlapping with the first wiring layer ML1 is illustrated.

The electro-optical device 1 according to the modification 1 is the same as the electro-optical device 1 in FIG. 1, except for the layout of the pre-charge selection transistor 154 and the pre-charge control signal line 113. With reference to FIG. 9, descriptions will be given focusing on the layout of the pre-charge selection transistor 154, which is a difference between the modification 1 and the first embodiment.

The pre-charge selection transistor 154[2q] is disposed on a side of the second direction D2 of the eight pre-charge control signals PSL[1] to PSL[8]. The pre-charge selection transistor 154[2q] is then disposed on an opposite side of the second direction D2 of the eight pre-charge control signals PSL[1] to PSL[8]. That is, the pre-charge selection transistor 154[2q−1] and the pre-charge selection transistor 154[2q] are separately arranged on one side and opposite side of the second direction D2 with the eight pre-charge control signals PSL[1] to PSL[8] interposed in between.

In the modification 1 as well, as in the first embodiment, the branch line 113b can be shortened compared to the layout in which the pre-charge control signal PSL is input to the pre-charge circuit 150 only from one direction. Accordingly, in the modification 1 as well, the parasitic capacitance serving as a driving load of the pre-charge control signal line 113 can be reduced, to thus drive the pre-charge selection transistor 154 at a high rate of speed.

Modification 2

In the third embodiment, the signal line 111 may extend over the drain of the pre-charge selection transistor 154.

Figure 10:
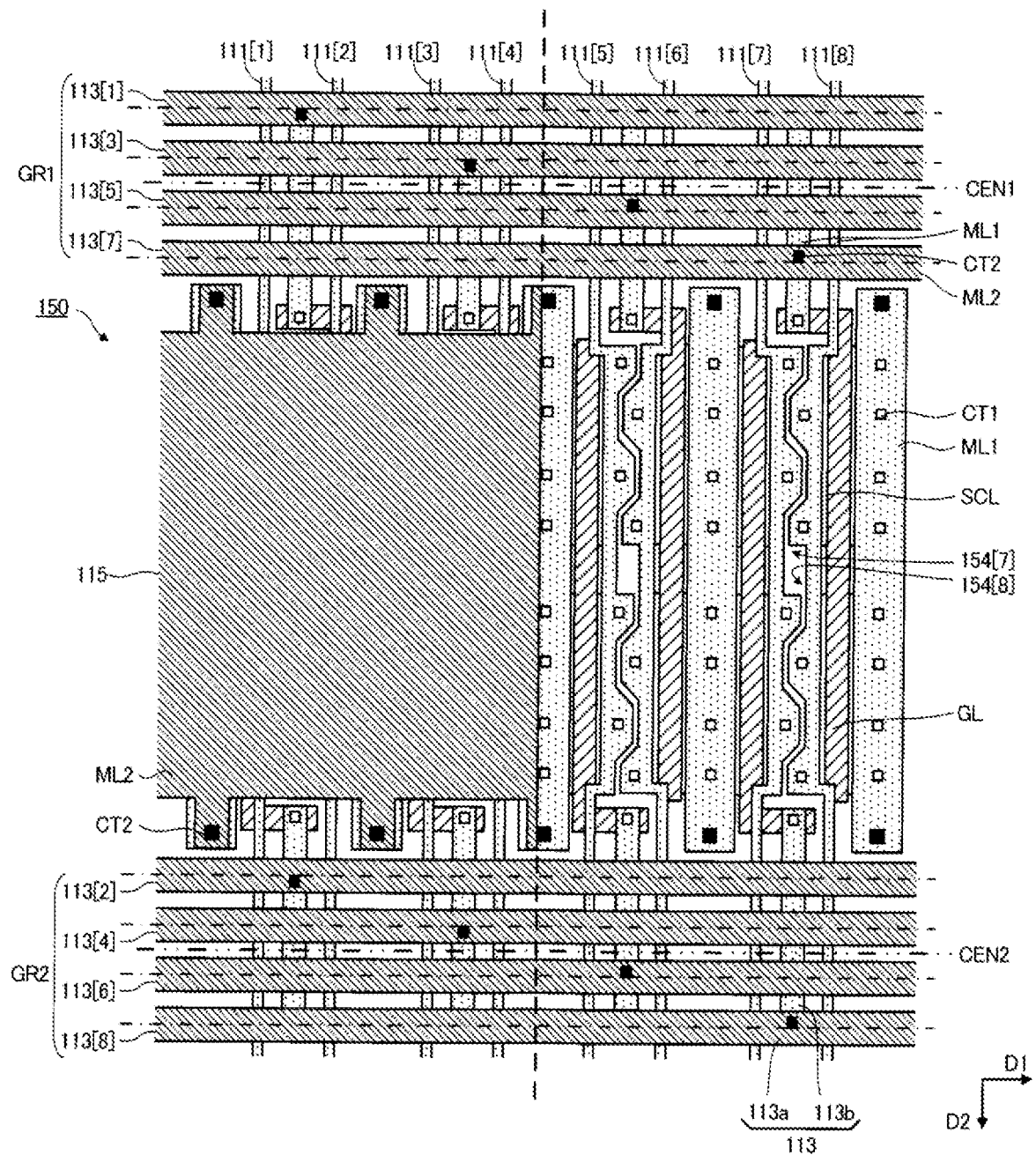
FIG. 10 is a plan view illustrating a layout of a pre-charge circuit and a periphery around the pre-charge circuit according to a modification 2.

FIG. 10 is a plan view illustrating a layout of the pre-charge circuit 150 and the periphery around the pre-charge circuit 150 according to the modification 2. Elements that are the same as those described with reference to FIGS. 1 to 9 are given the same reference signs, and detailed descriptions thereof will be omitted. In FIG. 10, as in FIG. 8, to make the configuration of the pre-charge selection transistor 154 easily viewable, the pre-charge power source line 115 on the right side from the dashed line in the figure is omitted to be illustrated.

The electro-optical device 1 according to the modification 2 is the same as the electro-optical device 1 in FIG. 1, except for the layout of the pre-charge selection transistor 154 and the signal line 111. With reference to FIG. 10, descriptions will be given focusing on the layout of the pre-charge selection transistor 154 and the signal line 111, which is a difference between the modification 2 and the third embodiment.

The signal line 111 extends over the drain of the pre-charge selection transistor 154 in the region in which the pre-charge selection transistor 154 is disposed. Accordingly, in the pre-charge selection transistors 154 adjacent to each other along the first direction D1, the spacing between the first wiring layers ML1 used for the signal line 111 becomes narrower than the example illustrated in FIG. 8. In other words, in the example illustrated in FIG. 8, the spacing of the first wiring layers ML1 used for the signal line 111 can be expanded compared to the layout illustrated in FIG. 10.

Note that, in the modification 2 as well, advantages as in the first embodiment can be obtained except for the advantages obtained by the gate of the transistor 154*a* and the gate of the transistor 154*b* being arranged along the first direction D1.

Modification 3

In each of the embodiments from the first embodiment to third embodiment, and the modification 1 and modification 2, the pre-charge circuit 150 may be disposed on an opposite side of the second direction D2 of the display region 120.

Modification 4

In each of the embodiments from the first embodiment to third embodiment, and each of the modifications from the modification 1 to modification 3, the n signal lines 111 may not be classified into the k signal line groups.

Modification 5

In each of the embodiments from the first embodiment to third embodiment, and each of the modifications from the modification 1 to modification 4, the electro-optical panel 100 may be a reflective electro-optical device. In addition, when the electro-optical panel 100 is of a reflective type, the electro-optical panel 100 may be of a Liquid Crystal on Silicon (LCOS) type that uses a semiconductor substrate for the element substrate SUB on which the signal line 111 and the like are formed.

Application Examples

Figure 11:
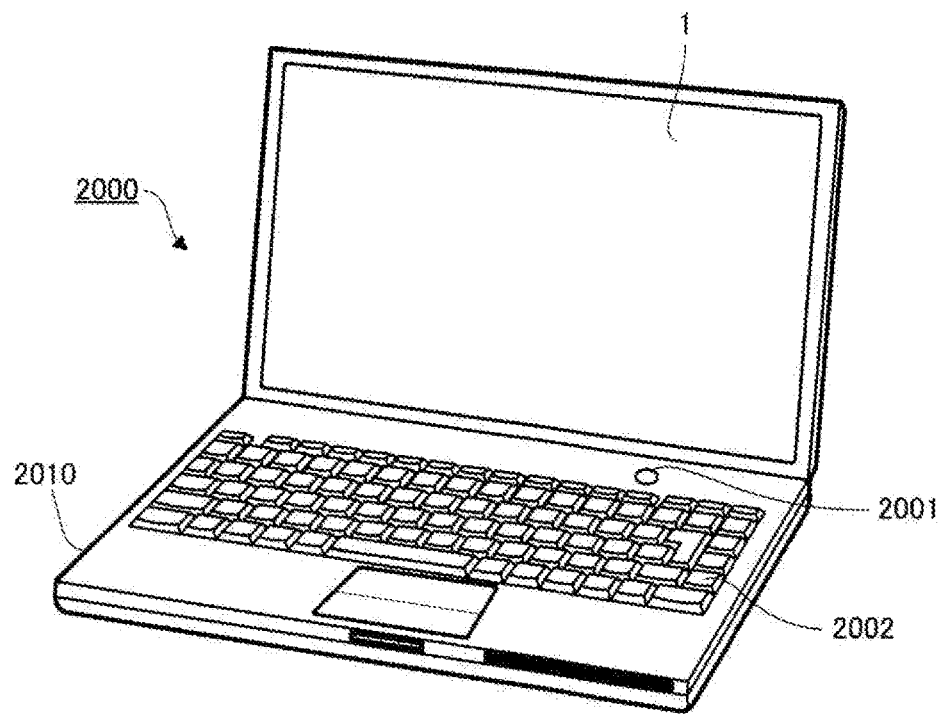
FIG. 11 is a perspective view illustrating a personal computer as an example of an electronic apparatus.
Figure 12:
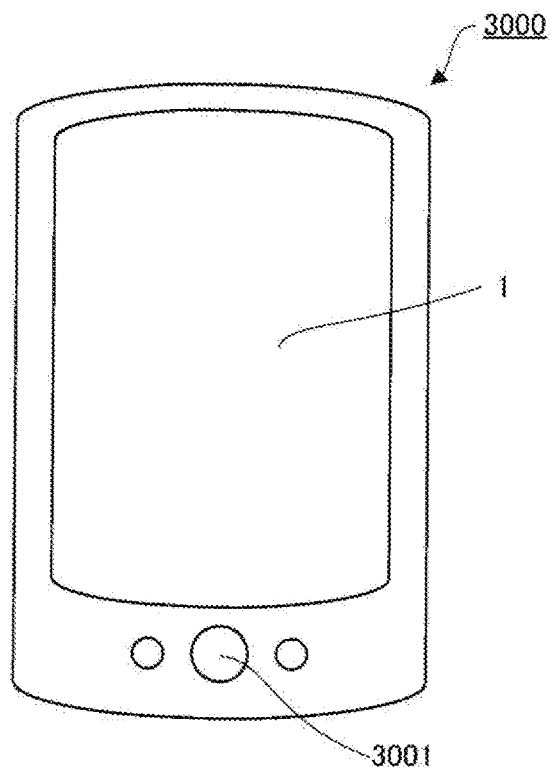
FIG. 12 is a front view illustrating a smart phone as an example of an electronic apparatus.
Figure 13:
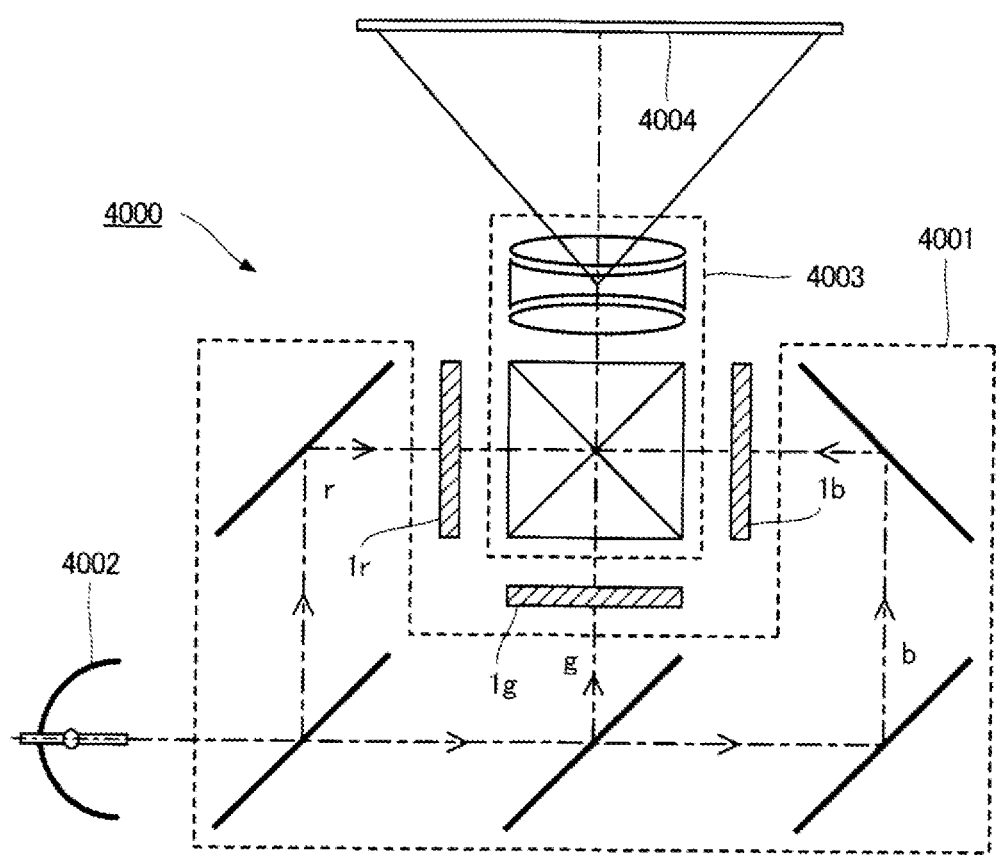
FIG. 13 is a view schematically illustrating a projection-type display apparatus as an example of an electronic apparatus.

The electro-optical device 1 can be used for various electronic devices. FIG. 11 to FIG. 13 exemplify specific aspects of electronic apparatuses to which the present disclosure is applied.

FIG. 11 is a perspective view illustrating a personal computer as an example of an electronic apparatus. The personal computer 2000 includes an electro-optical device 1 that displays various images, and a main body 2010 in which a power source switch 2001 and a keyboard 2002 are installed.

FIG. 12 is a front view illustrating a smart phone 3000 as an example of an electronic apparatus. The smart phone 3000 includes operation buttons 3001 and an electro-optical device 1 that displays various images. The screen content displayed on the electro-optical device 1 is changed in accordance with the operation of the operation buttons 3001.

FIG. 13 is a view schematically illustrating a projection-type display apparatus 4000 as an example of an electronic apparatus. The projection-type display apparatus 4000 is a three-plate type projector, for example. An electro-optical device 1*r* illustrated in FIG. 13 is an electro-optical device 1 corresponding to a red display color, an electro-optical device 1*g* is an electro-optical device 1 corresponding to a green display color, and an electro-optical device 1*b* is an electro-optical device 1 corresponding to a blue display color.

That is, the projection-type display apparatus 4000 includes three electro-optical devices 1*r*, 1*g*, and 1*b* that respectively correspond to display colors of red, green, and blue. An illumination optical system 4001 supplies a red element r of light emitted from an illumination device 4002 as a light source to the electro-optical device 1*r*, a green element g of the light to the electro-optical device 1*g*, and a blue element b of the light to the electro-optical device 1*b*. The electro-optical devices 1*r*, 1*g*, and 1*b* function as optical modulators, such as light valves, that modulate respective rays of the monochromatic light supplied from the illumination optical system 4001 in accordance with a displayed image. A projection optical system 4003 synthesizes the rays of light emitted from the electro-optical devices 1*r*, 1*g*, and 1*b* to project the synthesized light to a projection surface 4004.

Each of the above-described personal computer 2000, smart phone 3000, and projection-type display apparatus 4000 includes the above-described electro-optical device 1, thus improving image quality of the displayed image.

Note that, as electronic apparatuses to which the electro-optical device 1 is applied, in addition to the apparatuses exemplified in FIGS. 11, 12, and 13, there can be exemplified Personal Digital Assistants (PDA), digital still cameras, televisions, video cameras, car navigation apparatuses, in-vehicle displays, electronic organizers, electronic paper, calculators, word processors, workstations, video phones, and Point Of Sale (POS) terminals. Other examples of electronic apparatuses to which the electro-optical device 1 is further applied include apparatuses or the like provided with a printer, a scanner, a copier, a video player, and a touch panel.

The electro-optical devices and the electronic apparatuses are, but not limited to, those in the embodiments described above. In addition, the configuration of each of the components of the electro-optical devices and the electronic apparatuses may be replaced with any configuration that exerts equivalent functions as in the above-described embodiments, and to which any configuration may be added.

What is claimed is:

1. An electro-optical device comprising:
a scanning line extending along a first direction;
a first signal line and a second signal line extending along a second direction intersecting the first direction;
a first pixel provided corresponding to an intersection between the scanning line and the first signal line;
a second pixel provided corresponding to an intersection between the scanning line and the second signal line;

a signal line driving circuit configured to supply an image signal to the first pixel and the second pixel;
a plurality of first pre-charge control signal lines configured to supply a first pre-charge control signal, each of the plurality of first pre-charge control signal lines including:
a first main line extending along the first direction; and
a first branch line coupled to the first main line and extending along the second direction;
a plurality of second pre-charge control signal lines configured to supply a second pre-charge control signal, each of the plurality of second pre-charge control signal line including:
a second main line extending along the first direction; and
a second branch line coupled to the second main line and extending along the second direction; and
a pre-charge circuit disposed between the plurality of first pre-charge control signal lines and the plurality of second pre-charge control signal lines in the second direction, the pre-charge circuit being configured to supply a pre-charge signal to the first signal line and the second signal line, the pre-charge circuit including:
a first switching unit configured to supply the pre-charge signal to the first signal line in accordance with the first pre-charge control signal; and
a second switching unit configured to supply the pre-charge signal to the second signal line in accordance with the second pre-charge control signal,
wherein the first branch lines couple the first main lines and the first switching unit, and the second branch lines couple the second main lines and the second switching unit,
wherein the first branch line of each first pre-charge control signal line of the plurality of first pre-charge control signal lines crosses each of the first main lines of the plurality of first pre-charge control signal lines,
wherein the second branch line of each second pre-charge control signal line of the plurality of second pre-charge control signal lines crosses each of the second main lines of the plurality of second pre-charge control signal lines, and
wherein the pre-charge circuit is the only structure disposed between the plurality of first pre-charge control signal lines and the plurality of second pre-charge control signal lines in the second direction.

2. The electro-optical device according to claim 1, comprising
a pre-charge power source line extending along the first direction to cover at least a part of a region of the first switching unit and the second switching unit in a plan view viewed from a direction perpendicular to an image display surface, the pre-charge power source line being configured to supply the pre-charge signal to the pre-charge circuit.

3. The electro-optical device according to claim 1, wherein
the first switching unit includes two first transistors coupled in parallel,
the two first transistors are disposed along the first direction, and have a region of a semiconductor layer located between gates of the two first transistors as a common drain coupled to the first signal line,
the second switching unit includes two second transistors coupled in parallel, and
the two second transistors are disposed along the first direction, and have a region of a semiconductor layer located between gates of the two second transistors as a common drain coupled to the second signal line.

4. The electro-optical device according to claim 3, wherein
a plurality of the first switching units are arranged along the first direction,
a plurality of the second switching units are arranged, along the first direction, between the first switching unit and the plurality of second pre-charge control signal lines,
a source of a first transistor included in one of the first switching units adjacent to each other and a source of the first transistor included in the other one of the first switching units are separated from each other at a semiconductor layer, and
a source of a second transistor included in one of the second switching units adjacent to each other and a source of the second transistor included in the other one of the second switching units are separated from each other at a semiconductor layer.

5. The electro-optical device according to claim 3, wherein
the second switching unit is disposed between the first switching unit and the plurality of second pre-charge control signal lines,
the two first transistors include a first drain electrode, disposed on a semiconductor layer of drain, as a wiring layer in a same layer as the first signal line,
the two second transistors include a second drain electrode, disposed on the region of the semiconductor layer corresponding to the drain of the two second transistors, as a wiring layer in a same layer as the second signal line, and
the first drain electrode is coupled to the first signal line at an end portion on a side of the second drain electrode, and
the second drain electrode is coupled to the second signal line at an end portion on a side of the first drain electrode.

6. The electro-optical device according to claim 1, wherein
the first switching unit includes a first transistor having a gate coupled to the plurality of first pre-charge control signal lines and a drain coupled to the first signal line,
the second switching unit includes a second transistor having a gate coupled to the plurality of second pre-charge control signal lines and a drain coupled to the second signal line,
the first transistor and the second transistor are disposed along the first direction such that the drains thereof face each other,
the first signal line extends along the second direction over a gate of the first transistor when viewed in a plan view from a direction perpendicular to an image display surface, and
the second signal line extends along the second direction over a gate of the second transistor when viewed in a plan view from a direction perpendicular to an image display surface.

7. The electro-optical device according to claim 1, comprising:
a plurality of the first signal line, the second signal line, the first switching unit, and the second switching unit, wherein
for each of the plurality of first pre-charge control signal lines, the first branch line is coupled to the first main line at a position offset in a first offset direction from a center of a width, along the second direction, of the first main line, for each of the plurality of second pre-charge control signal lines, the second branch line is coupled to the second main line at a position offset in a second offset direction from a center of a width, along the second direction, of the second main line, the first main line of each of the plurality of the first pre-charge control signal lines is disposed along the second direction, the second main line of each of the plurality of the second pre-charge control signal lines is disposed along the second direction, and the first offset direction is a direction toward the center of a width along the second direction in a range in which the first main lines disposed along the second direction are located, and the second offset direction is a direction toward the center of a width along the second direction in a range in which the second main lines disposed along the second direction are located.

8. The electro-optical device according to claim 1, wherein
a shape of the first switching unit when viewed from a side of the plurality of first pre-charge control signal lines is similar to a shape of the second switching unit when viewed from a side of the plurality of second pre-charge control signal lines.

9. The electro-optical device according to claim 1, wherein
the pre-charge circuit is disposed on a side of the second direction of the plurality of pixels.

10. The electro-optical device according to claim 1, wherein
the pre-charge circuit is disposed on an opposite side of the second direction of the plurality of pixels.

11. An electronic apparatus, comprising:
the electro-optical device according to claim 1.

12. The electro-optical device according to claim 1, wherein the first branch lines extend in a positive second direction from the first main lines to the first switching unit and the second branch lines extend in a negative second direction from the second main lines to the second switching unit.

13. An electro-optical device comprising:
a scanning line extending along a first direction;
a signal line extending along a second direction intersecting the first direction;
a pixel provided corresponding to an intersection between the scanning line and the signal line;
a signal line driving circuit disposed outside a display region in which the pixel is disposed, the signal line driving circuit being configured to supply an image signal to the pixel;
a plurality of first pre-charge control signal lines configured to supply a first pre-charge control signal, each of the plurality of first pre-charge control signal lines including:
a first main line extending along the first direction; and
a first branch line coupled to the first main line and extending along the second direction;
a plurality of second pre-charge control signal lines configured to supply a second pre-charge control signal, each of the plurality of second pre-charge control signal lines including:
a second main line extending along the first direction; and
a second branch line coupled to the second main line and extending along the second direction and
a pre-charge circuit disposed between the display region and the signal line driving circuit and between the plurality of first pre-charge control signal lines and the plurality of second pre-charge control signal lines in the second direction, the pre-charge circuit being configured to supply a pre-charge signal to the signal line, the pre-charge circuit including a switching unit configured to supply the pre-charge signal to the signal line in accordance with the first pre-charge control signal,
wherein the first branch lines couple the first main lines and the switching unit,
wherein the first branch line of each first pre-charge control signal line of the plurality of first pre-charge control signal lines crosses each of the first main lines of the plurality of first pre-charge control signal lines,
wherein the second branch line of each second pre-charge control signal line of the plurality of second pre-charge control signal lines crosses each of the second main lines of the plurality of second pre-charge control signal lines, and
wherein the pre-charge circuit is the only structure disposed between the plurality of first pre-charge control signal lines and the plurality of second pre-charge control signal lines in the second direction.

14. An electro-optical device comprising:
a scanning line extending along a first direction;
a first signal line and a second signal line extending along a second direction intersecting the first direction;
a first pixel provided corresponding to an intersection between the scanning line and the first signal line;
a second pixel provided corresponding to an intersection between the scanning line and the second signal line;
a signal line driving circuit configured to supply an image signal to the first pixel and the second pixel;
a plurality of first pre-charge control signal lines configured to supply a first pre-charge control signal, each of the plurality of first pre-charge control signal lines including:
a first main line extending along the first direction; and
a first branch line coupled to the first main line and extending along the second direction;
a plurality of second pre-charge control signal lines configured to supply a second pre-charge control signal, each of the plurality of second pre-charge control signal line including:
a second main line extending along the first direction; and
a second branch line coupled to the second main line and extending along the second direction;
a pre-charge circuit disposed between the plurality of first pre-charge control signal lines and the plurality of second pre-charge control signal lines in the second direction, the pre-charge circuit being configured to supply a pre-charge signal to the first signal line and the second signal line, the pre-charge circuit including:
a first switching unit configured to supply the pre-charge signal to the first signal line in accordance with the first pre-charge control signal; and
a second switching unit configured to supply the pre-charge signal to the second signal line in accordance with the second pre-charge control signal, wherein the first branch lines couple the first main lines and the first switching unit, and the second branch lines couple the second main lines and the second switching unit, wherein the first branch line of each first pre-charge control signal line of the plurality of first pre-charge control signal lines crosses each of the first main lines of the plurality of first pre-charge control signal lines, and wherein the second branch line of each second pre-charge control signal line of the plurality of second pre-charge control signal lines crosses each of the second main lines of the plurality of second pre-charge control signal lines; and a pre-charge power source line extending along the first direction to cover at least a part of a region of the first switching unit and the second switching unit in a plan view viewed from a direction perpendicular to an image display surface, the pre-charge power source line being configured to supply the pre-charge signal to the pre-charge circuit, wherein the pre-charge power source line is disposed between the first main lines and the second main lines and extends along the first main lines and the second main lines in the first direction.

\* \* \* \* \*